United States Patent
Koga

(10) Patent No.: US 7,470,964 B2
(45) Date of Patent: Dec. 30, 2008

(54) MAGNETIC MEMORY AND MANUFACTURING METHOD THEREOF

(75) Inventor: Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 118 days.

(21) Appl. No.: 11/218,490

(22) Filed: Sep. 6, 2005

(65) Prior Publication Data

US 2006/0056232 A1 Mar. 16, 2006

(30) Foreign Application Priority Data

Sep. 7, 2004 (JP) ............................ P2004-260160

(51) Int. Cl.
*H01L 29/78* (2006.01)
(52) U.S. Cl. ............... 257/421; 257/295; 257/E21.665; 365/171; 365/173
(58) Field of Classification Search ........... 257/421, 257/422, 295, E21.665; 365/53, 57, 171, 365/173
See application file for complete search history.

(56) References Cited

U.S. PATENT DOCUMENTS 5,783,483 A * 7/1998 Gardner .................. 438/627
6,487,110 B2 * 11/2002 Nishimura et al. ........ 365/158
7,038,939 B2 * 5/2006 Amano et al. ............ 365/158
2003/0081454 A1 5/2003 Miyatke et al.
2003/0214862 A1 11/2003 Asao et al.

FOREIGN PATENT DOCUMENTS

| EP | 1 422 720 A2 | 5/2004 |
|---|---|---|
| JP | A 2001-358315 | 12/2001 |
| JP | A 2002-110938 | 4/2002 |
| JP | A 2004-153182 | 5/2004 |

\* cited by examiner

*Primary Examiner*—Andy Huynh
*Assistant Examiner*—Thinh T Nguyen
(74) *Attorney, Agent, or Firm*—Oliff & Berridge, PLC

(57) ABSTRACT

A magnetic memory capable of reducing diffusion of ferromagnetic material into semiconductor element area is provided. A magnetic memory 1 includes plural memory areas 3 disposed in two-dimension of m rows and n columns (m, n are integers of 2 or more). The magnetic memory 1 includes semiconductor layer 6 including drain area 32*a* and source area 32*c* for write transistor 32, magnetic material layer 8 including TMR element 4 and write wiring 31, and wiring layer 7 including bit wirings 13*a* and 13*b* and word wiring 14 being sandwiched between semiconductor layer 6 and magnetic material layer 8. Since wiring layer 7 is sandwiched between magnetic material layer 8 and semiconductor layer 6, the ferromagnetic material diffusing (migrates) from TMR element 4 hardly reaches to semiconductor layer 6. Thus, the diffusion of the ferromagnetic material into the drain area 32*a* and the source area 32*c* can be reduced.

4 Claims, 39 Drawing Sheets

MAGNETIC MEMORY AND MANUFACTURING METHOD THEREOF

BACKGROUND OF THE INVENTION

1. Field of the Invention

The present invention relates to a magnetic memory, which stores data in a magnetoresistive effect element and a manufacturing method thereof.

2. Related Background of the Invention

Recently, as a memory device employed in information processing apparatus such as computer and communication device, there is growing interest in a MRAM (Magnetic Random Access Memory). Since the MRAM stores data by means of magnetism, unlike volatile memory such as DRAM (Dynamic Random Access Memory) and SRAM (Static RAM), it has not such disadvantage that information is lost due to a power break-off. Also, compared with conventional nonvolatile storage such as flash EEPROM and hard disk device, the MRAM is superior in access speed, reliability, power consumption and so on. Accordingly, the MRAM may perform both of the functions as a volatile memory such as DRAM and SRAM and as a nonvolatile storage such as flash EEPROM and hard disk device. An information apparatus, which is capable of, so called, ubiquitous computing enabling information processing anytime, anywhere, is now progressively under development. The MRAM is expected to perform as a key device in such information apparatus.

FIG. 39A is a side sectional view showing an example of structure of a memory area 100 in a conventional MRAM. The conventional MRAM is equipped with a plurality of wirings 102 extending in one direction and a plurality of wirings 104 extending in the direction crossing the wirings 102. The memory area 100 is formed in every area where the wirings 102 and 104 cross each other. Each memory area 100 has a tunneling magnetoresistive element (referred to as TMR element) 101, which utilizes the tunneling magnetoresistive (TMR) effect. As shown in FIG. 39B, the TMR element 101 includes a first magnetic layer (magneto-sensitive layer) 101a of which magnetizing direction A changes depending on the external magnetic field, a second magnetic layer 101c of which magnetizing direction B is fixed by an antiferromagnetic layer 101d and a nonmagnetic insulating layer 101b sandwiched between the first magnetic layer 101a and the second magnetic layer 101c. By controlling the magnetizing direction A of the first magnetic layer 101a by means of the synthetic magnetic field from the wirings 102 and 104 to be parallel or anti-parallel with the magnetizing direction B, binary data of 0 or 1 are written in the TMR element 101. The resistant value in the thickness direction of the TMR element 101 varies depending on the magnetizing direction A in the first magnetic layer 101a and the magnetizing direction B in the second magnetic layer 101c; i.e., whether the directions are parallel or anti-parallel with each other. Accordingly, to read the binary data from the TMR element 101, the transistor 105 is set to the conductive status to flow the current from the wiring 102 connected to the first magnetic layer 101a to the wiring 103 connected to the second magnetic layer 101c. Based on the current value or the potential difference between the first magnetic layer 101a and the second magnetic layer 101c, it is determined whether which value of the binary data is recorded.

The same configurations as that of the above MRAM are disclosed in, for example, Patent Documents 1 and 2.

There resides the following problem in the configuration of the MRAM shown in FIG. 39A and FIG. 39B. That is, in this MRAM, it is preferred that the magnetizing direction A of the first magnetic layer 101a is inverted only in the TMR element 101 which is given with the magnetic field from both of the wirings 102 and 104. However, the wirings 102 and 104 provide the magnetic field to every TMR element 101 disposed along the respective extending direction. Accordingly, there is a possibility that, in the TMR element 101 other than a target TMR element 101 to be written with binary data, the magnetizing direction A of the first magnetic layer 101a could be erroneously inverted by the magnetic field from the wiring 102 or 104.

As a technique to prevent such erroneous writes, for example, a magnetic memory disclosed in the patent document 3 is known. This magnetic memory is equipped with a TMR element for each memory area (memory cell), a wiring (cell bit line) for flowing the write current to the TMR element and a transistor connected to the cell bit line. Thus, by controlling the write current for writing binary data to the TMR element using the transistor, only the target TMR element to be written with binary data is given with the magnetic field.

[Patent document 1] Japanese Patent Application Laid-open No. 2001-358315

[Patent document 2] Japanese Patent Application Laid-open No. 2002-110938

[Patent document 3] Japanese Patent Application Laid-open No. 2004-153182

However, there resides the following common problem in the configurations disclosed in the patent documents 1 to 3. That is, in these MRAM configurations, the TMR elements are disposed between the wirings (for example, the wirings 102 in FIG. 39A, or bit lines BL in the patent document 3 etc), which extend through pluralities of memory areas and the substrate. In other words, the TMR elements are disposed within the layer (wiring layer) in which a wiring system extending over plural memory areas is formed. On the other hand, on the surface of the substrate on which the wiring layer is built up, a semiconductor element area such as a transistor for controlling the current for reading the binary data from the TMR element (for example, the transistor 105 in FIG. 39A etc) and a transistor for controlling the write current for writing binary data to the TMR element (for example, write select transistor 19 in the patent document 3) is formed. In such MRAM configuration, ferromagnetic material such as Mn, Fe, Ni and Co diffused (migration) from the TMR element into the wiring layer gradually reaches to the transistor on the substrate surface as time passes, mixes with another dopant (contamination), causing a deterioration of the electrical characteristics of the transistor. Accordingly, the life of the MRAM is largely reduced. Also, in the manufacturing process of the MRAM, there is a possibility that ferromagnetic material is mixed into the semiconductor element area formed on the substrate surface.

The present invention has been proposed in view of the above-described problems. An object of the present invention is to provide a manufacturing method of a magnetic memory capable of reducing the diffusion of the ferromagnetic material into semiconductor element area, and a magnetic memory capable of preventing the ferromagnetic material from being mixed into the semiconductor element area in the manufacturing process thereof.

SUMMARY OF THE INVENTION

To solve the above problem, a magnetic memory according to the present invention is a magnetic memory having a plurality of memory areas disposed in two-dimensional configuration of m rows and n columns (m and n are integers of 2 or more), comprising:

a magnetic material layer, a semiconductor layer and a wiring layer, which is formed between the magnetic material layer and the semiconductor layer, wherein the magnetic material layer includes a magnetoresistive effect element, which includes a magneto-sensitive layer of which magnetizing direction changes depending on the external magnetic field, provided to each of the plurality of memory areas, and a write wiring, which is provided to each of the plurality of memory areas, for providing the external magnetic field to the magneto-sensitive layer through write current, the semiconductor layer includes a semiconductor area constituting a semiconductor write switching device for controlling the conduction of the write current in the write wiring in each of the plurality of memory areas, the wiring layer includes a first wiring, which is formed corresponding to each column of the plurality of memory areas and electrically connected to the write wiring included in each of the memory areas of the corresponding column, and a second wiring, which is formed corresponding to each row of the plurality of memory areas and electrically connected to a control terminal of the semiconductor write switching device in the memory area of the corresponding row.

In the above-described magnetic memory, between the magnetic material layer including the TMR element and the semiconductor layer including the semiconductor write switching device, which is kind of a semiconductor element area, the wiring layer, which includes the first wiring corresponding to each column of the memory areas and the second wiring corresponding to each row, is formed. As described above, between the layer (magnetic material layer) including the TMR element and the layer (semiconductor layer) including the semiconductor element area, by sandwiching another layer (wiring layer), the ferromagnetic material diffused from the TMR element hardly reaches to the semiconductor layer. Accordingly, the diffusion of the ferromagnetic material into the semiconductor area constituting the semiconductor write switching device can be reduced. Also according to the above-described magnetic memory, the process preparing the magnetic material layer and the process forming the wiring layer and the semiconductor layer can be separated from each other. Therefore, the TMR element can be formed in a state that the wiring layer protects the semiconductor write switching device. Accordingly, in the manufacturing process, the ferromagnetic material can be prevented from mixing into the semiconductor area constituting the semiconductor write switching device.

In the above-described magnetic memory, the second wiring electrically connected to the control terminal of the semiconductor write switching device includes such a mode in which a part of the second wiring commonly serves as the control terminal (electrode) of the semiconductor writing device.

Further, the magnetic memory may includes an anti-diffusion layer, which is formed between the magnetic material layer and the semiconductor layer, for preventing an element included in the magnetoresistive effect element from diffusing into the semiconductor layer. Owing to this, the diffusion of the ferromagnetic material into the semiconductor area constituting the semiconductor write switching device can be reduced more efficiently. In the manufacturing process, the ferromagnetic material can be prevented more efficiently from mixing into the semiconductor area constituting the semiconductor write switching device.

Furthermore, in the magnetic memory, the anti-diffusion layer may include at least one element selected from a group consisting of Ti and Ru. Owing to this, in the anti-diffusion layer, the function to prevent the element included in the magnetoresistive effect device from diffusing into the semiconductor layer can be appropriately achieved.

Still further, in the magnetic memory, the magnetic material layer may further include a read wiring, which is provided to each of the plurality of memory areas and electrically connected to the magnetoresistive effect element, for flowing a read current to the magnetoresistive effect element, the semiconductor layer further includes a semiconductor area constituting a semiconductor read switching device for controlling the conduction of the read current in the read wiring in each of the plurality of memory areas. Owing to this, the binary data stored in the TMR element can be appropriately read out. Also, as described above, in the magnetic memory, between the semiconductor layer and the magnetic material layer, a wiring layer is sandwiched. Accordingly, the diffusion of the ferromagnetic material into the semiconductor area constituting the semiconductor read switching device, which is a kind of a semiconductor element area, can be reduced. And further, in the manufacturing process, it is possible to prevent the ferromagnetic material from mixing into the semiconductor area constituting the semiconductor read switching device.

A manufacturing method of the magnetic memory according to the present invention is a manufacturing method of a magnetic memory having a plurality of memory areas disposed in two-dimensional configuration of m rows and n columns (m, n are integers of 2 or more), comprising: a semiconductor layer forming process for forming a semiconductor layer; a wiring layer forming process for forming a wiring layer on the semiconductor layer; and a magnetic material layer forming process for forming a magnetic material layer on the wiring layer, wherein the semiconductor layer forming process includes a process for forming a semiconductor area constituting a semiconductor write switching device in each of the plurality of memory areas in the semiconductor layer, the wiring layer forming process includes a process for forming a first wiring corresponding to each column of the plurality of memory areas and a second wiring, which is provided corresponding to each row of the plurality of memory areas and electrically connected to a control terminal of the semiconductor write switching device included in each of the memory areas in the corresponding row, in the wiring layer, the magnetic material layer forming process includes a process for forming a magnetoresistive effect element including a magneto-sensitive layer, which is provided to each of the plurality of memory areas and the magnetizing direction thereof changes depending on the external magnetic field, and a write wiring formed in each of the plurality of memory areas and electrically connected to the first wiring for providing the external magnetic field to the magneto-sensitive layer using a write current to the magnetic material layer.

The above-described manufacturing method of the magnetic memory comprises the semiconductor layer forming process including the process forming the semiconductor area constituting the semiconductor write switching device which is a kind of a semiconductor element area, the wiring layer forming process including the process forming the first and second wirings, and the magnetic material layer forming process including the process forming the TMR element. As described above, the process to form the semiconductor area constituting the semiconductor write switching device, the process to form the first and second wirings and the process to form the TMR element are perfectly separated from each other. When the TMR element is built within the magnetic material layer, the wiring layer blocks the ferromagnetic material. Accordingly, the ferromagnetic material can be prevented from mixing into the semiconductor area constituting a semiconductor write switching device According to the magnetic memory of the present invention, the diffusion of the ferromagnetic material into the semiconductor element area can be reduced. Also, according to the manufacturing method of the magnetic memory of the present invention, the ferromagnetic material can be prevented from mixing into the semiconductor element area in the manufacturing process thereof.

DESCRIPTION OF THE PREFERRED EMBODIMENTS

Figure 1:
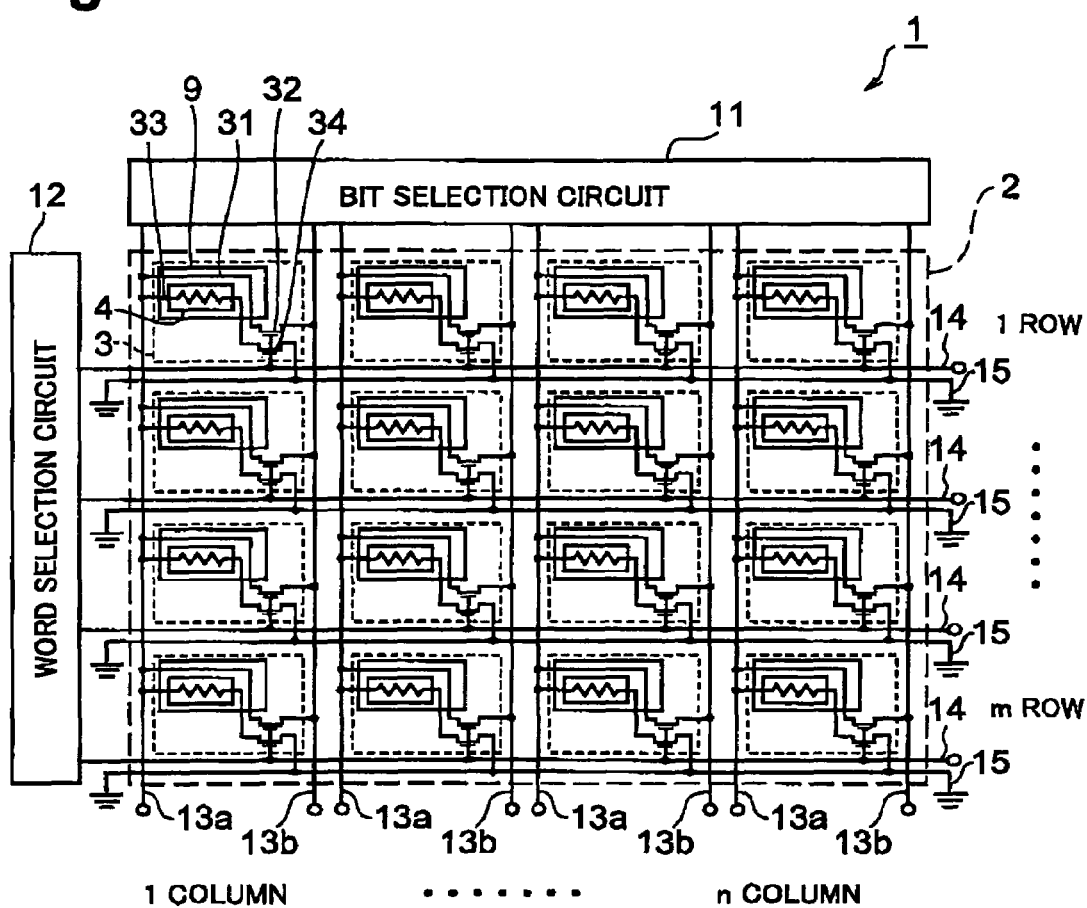
FIG. 1 is a diagram schematically showing the entire configuration of a magnetic memory in accordance with one embodiment.

Hereinafter, embodiments of a magnetic memory and manufacturing method thereof in accordance with the present invention will be described in detail with reference to the accompanying drawings. In the description of the drawings, the identical elements will be given with identical reference numerals, and redundant descriptions thereof will be omitted.

First of all, a configuration of a magnetic memory in accordance with an embodiment of the present invention will be described. FIG. 1 is a diagram schematically showing the entire configuration of a magnetic memory 1 in accordance with the embodiment. The magnetic memory 1 includes a memory section 2, a bit selection circuit 11, a word selection circuit 12, bit wirings 13a, 13b , a word wiring 14, and a grounding wiring 15. The memory section 2 includes a plurality of memory areas 3. The pluralities of memory areas 3 are two-dimensionally disposed including m rows and n columns (m, n are integers of 2 or more). Each of the plural memory areas 3 has a magnetic element section 9, which includes a TMR element 4, a write wiring 31 and a read wiring 33, a write transistor 32 and a read transistor 34.

The TMR element 4 is a magnetoresistive effect element including a magneto-sensitive layer of which magnetizing direction changes depending on the external magnetic field. Specifically, the TMR element 4 configured including a first magnetic layer as a magneto-sensitive layer, a second magnetic layer of which magnetizing direction is fixed, and a nonmagnetic insulating layer sandwiched between the first magnetic layer and the second magnetic layer. TMR element 4 is disposed along a part of the write wiring 31 so that the magnetizing direction of the first magnetic layer changes under the external magnetic field, which is generated by the write current flowing through the write wiring 31. When the magnetizing direction of the first magnetic layer is changed by the write current, the resistant value between the first magnetic layer and the second magnetic layer changes in accordance with the relationship between the magnetizing direction of the first magnetic layer and the magnetizing direction of the second magnetic layer.

The write wiring 31 is a wiring for providing an external magnetic field to the first magnetic layer of the TMR element 4 by means of the write current. One end of the write wiring 31 is electrically connected to a bit wiring 13a. The other end of the write wiring 31 is electrically connected to the source or the drain of the write transistor 32. The write transistor 32 is a semiconductor write switching device for controlling the conduction of the write current in the write wiring 31. In the write transistor 32, one of the drain and the source is electrically connected to the write wiring 31 and the other is electrically connected to the bit wiring 13b. The gate of the write transistor 32 is electrically connected to the word wiring 14.

The read wiring 33 is a wiring for flowing a read current through the TMR element 4. Specifically, one end of the read wiring 33 is electrically connected to the bit wiring 13a; and the other end of the read wiring 33 is electrically connected to the first magnetic layer side of the TMR element 4. The read transistor 34 is a semiconductor read switching device for controlling the conduction of the read current in the read wiring 33. One of the sources and the drain of the read transistor 34 is electrically connected to the second magnetic layer side of the TMR element 4; and the other of the source and the drain is electrically connected to the grounding wiring 15. The gate of the read transistor 34 is electrically connected to the word wiring 14. The wording "first magnetic layer side (second magnetic layer side) of the TMR element 4" means the first magnetic layer side or the second magnetic layer side with respect to the nonmagnetic insulating layer including the case being interposed by another layer on the first magnetic layer (second magnetic layer).

The bit wirings 13a and 13b are disposed for each column of the memory area 3. The bit wirings 13a and 13b are the first wirings in this embodiment. That is, the bit wiring 13a is electrically connected to one end of the write wiring 31 included in each of the memory areas 3 in the corresponding column. Further, the bit wiring 13a of the embodiment is electrically connected to one end of the read wiring 33 included in each of the memory area 3 in the corresponding column. The bit wiring 13b is electrically connected to the drain or the source of the write transistor 32 included in each of the memory areas 3 in the corresponding column. The word wiring 14 is a second wiring in this embodiment. That is, the word wiring 14 is disposed corresponding to each row of the memory areas 3 and is electrically connected to the gate, which is a control terminal of the write transistor 32 included in each memory area 3 in the corresponding row.

The bit selection circuit 11 is a write current generating device in this embodiment. That is, the bit selection circuit 11 has a function to provide a positive or negative write current to the write wiring 31 in each memory area 3. Specifically, the bit selection circuit 11 is configured including an address decoder circuit, which selects a column corresponding to the address in accordance with the specified address when writing data from the inside or outside of the magnetic memory 1, and a current drive circuit, which supplies a positive or negative write current between the bit wiring 13a and the wiring 13b corresponding to the selected column. Also, the word selection circuit 12 has a function to, select a row corresponding to the selected row in accordance with the address specified when writing data from the inside or the outside of the magnetic memory 1 and provide a control voltage to the word wiring 14 corresponding to the address.

The magnetic memory 1 configured as described above operates as described below. That is, when an address (i-th row j-th column/$1 \leq i \leq m$, $1 \leq j \leq n$) to be written with data is specified from the inside or the outside of the magnetic memory 1, the bit selection circuit 11 and the word selection circuit 12 select corresponding j-th column and i-th row respectively. In the write transistor 32 of a memory area 3 included in the i-th row selected by the word selection circuit 12, a control voltage is impressed to the gate, and a state that the write current is conductive is established. In a memory area 3 included in the j-th column selected by the bit selection circuit 11, a positive or negative voltage is impressed between the bit wiring 13a and the bit wiring 13b in accordance with the data. In the memory area 3 included in both of the j-the column selected by the bit selection circuit 11 and the i-th row selected by the word selection circuit 12, a write current is generated on the write wiring 31 via the write transistor 32, and the magnetizing direction of the first magnetic layer of the TMR element 4 is inverted by the magnetic field of the write current. Thus, binary data are written in the memory area 3 at the specified address (i-th row, j-th column).

When an address (k-th row, l-th column/$1 \leq k \leq m$, $1 \leq l \leq n$) from which data are read is specified from the inside or the outside of the magnetic memory 1, the bit selection circuit 11 and the word selection circuit 12 select the corresponding l-th column and k-th row respectively. In the read transistor 34 of the memory area 3 included in the k-th row selected by the word selection circuit 12, a control voltage is impressed to the gate, and a state that the read current is conductive is established. Also, to the bit wiring 13a corresponding to the l-th column selected by the bit selection circuit 11, a voltage for flowing a read current is impressed from the bit selection circuit 11. In the memory area 3 included in both of the l-th column selected by the bit selection circuit 11 and the k-th row selected by the word selection circuit 12, the read current from the read wiring 33 flows to the grounding wiring 15 via the TMR element 4 and the read transistor 34. And by determining the amount of the voltage drop in, for example, the TMR element 4, the binary data stored in the memory area 3 at the specified address (k-th row l-th column) are read out.

Figure 2:
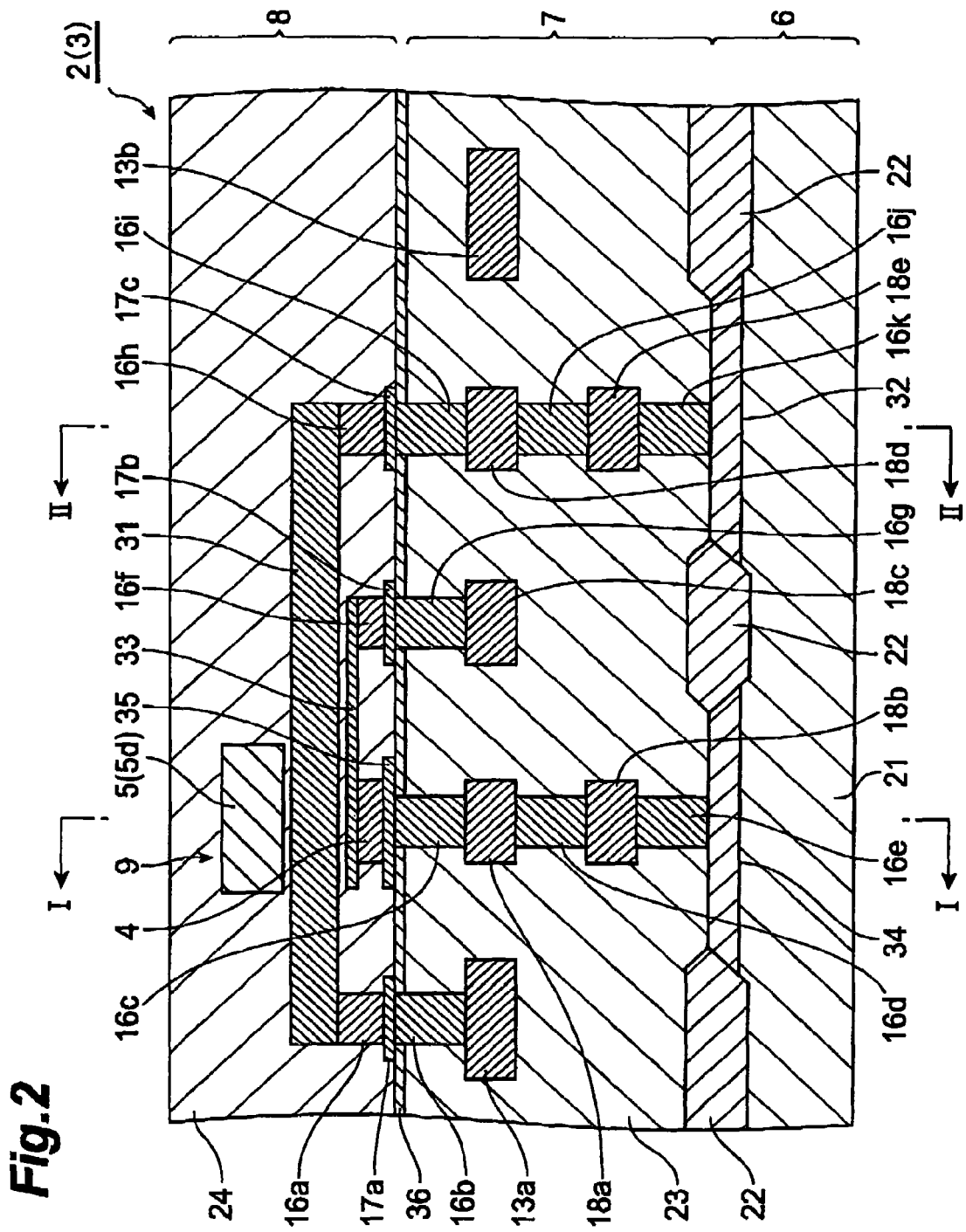
FIG. 2 is an enlarged section of a memory section showing a sectional configuration taken along the line direction.
Figure 3:
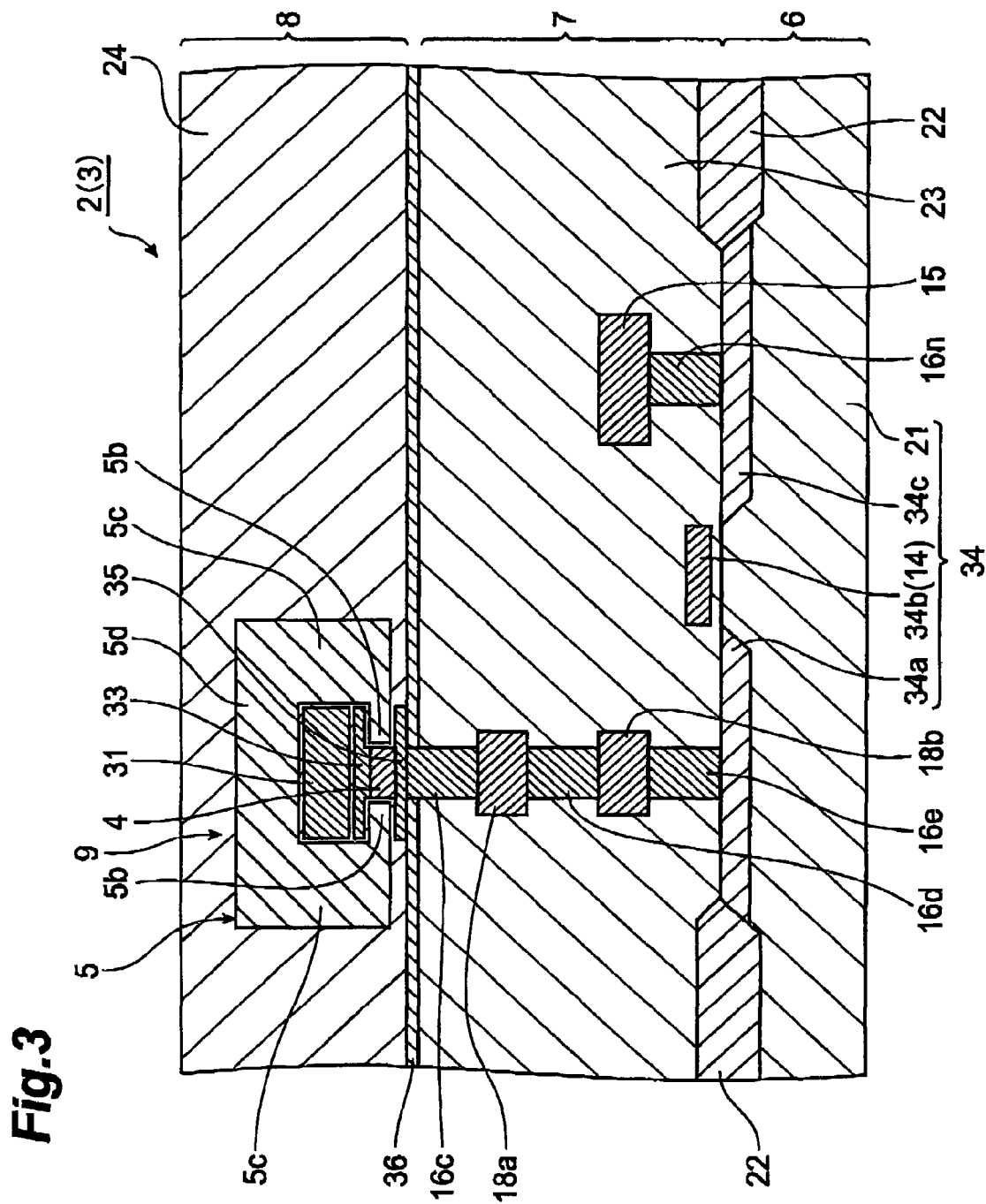
FIG. 3 is an enlarged section of the memory section taken along the line I-I in FIG. 2.
Figure 4:
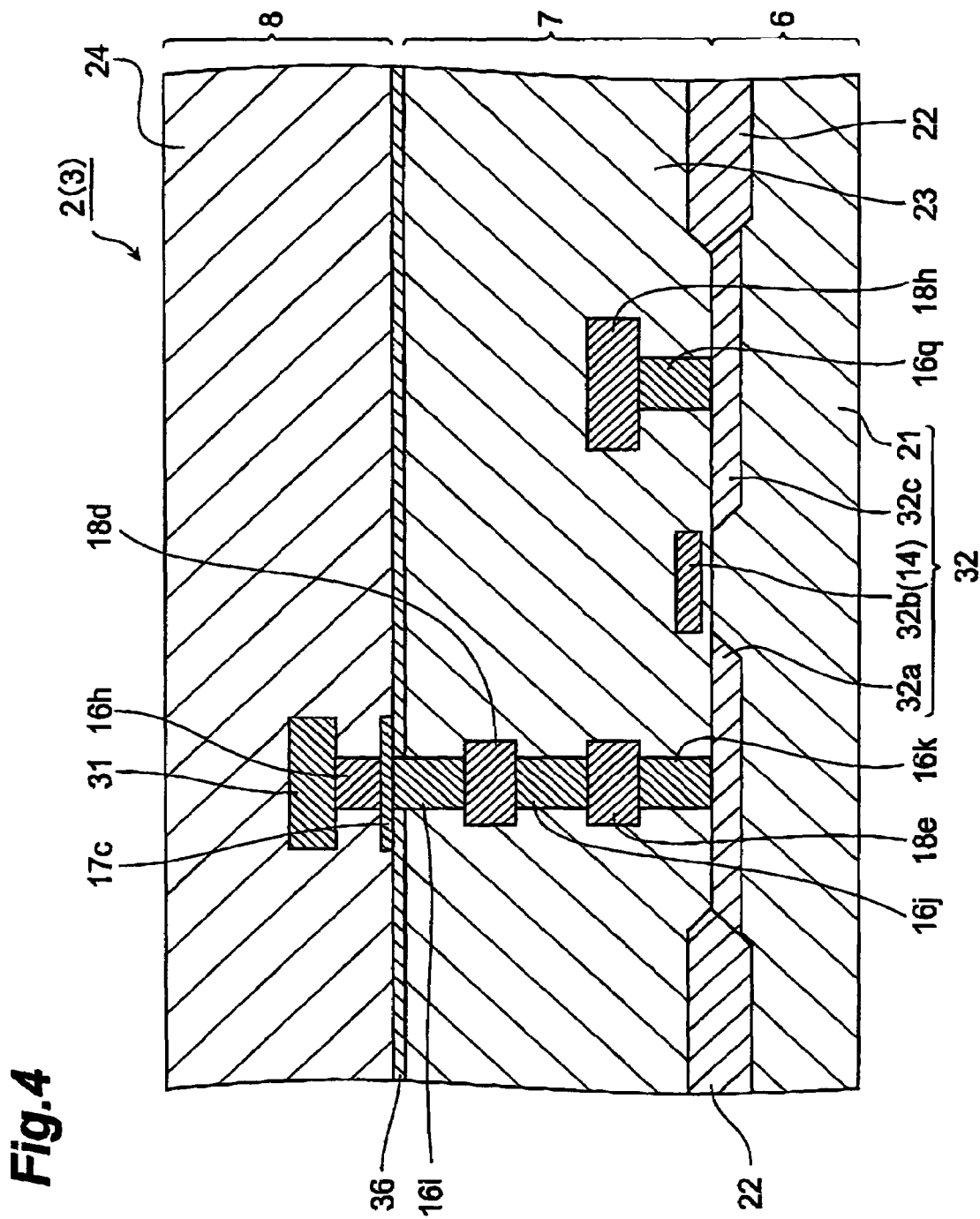
FIG. 4 is an enlarged section of the memory section taken along the line II-II in FIG. 2.

Particular configuration of the memory section 2 in this embodiment will be described below in detail. FIG. 2 is an enlarged section showing a sectional configuration when the memory section 2 is cut off along the line direction. FIG. 3 is an enlarged section when the memory section 2 is cut off along the line I-I in FIG. 2. FIG. 4 is an enlarged section when the memory section 2 is cut off along the line II-II in FIG. 2.

Referring to FIG. 2 to FIG. 4, the memory section 2 includes a semiconductor layer 6, a wiring layer 7, a magnetic material layer 8 and an anti-diffusion layer 36. The semiconductor layer 6 is a layer, which includes a semiconductor substrate 21 to maintain the mechanical strength of the entire memory section 2, and is formed with an area of semiconductor element such as transistor. The magnetic material layer 8 is a layer in which component elements (magnetic element section 9) such as the TMR element 4 and a magnetic yoke 5 including a magnetic material for efficiently giving a magnetic field to the TMR element 4 are formed. The wiring layer 7 is formed between the semiconductor layer 6 and the magnetic material layer 8. The wiring layer 7 is a layer in which wirings such as the bit wirings 13a, 13b and the word wiring 14 penetrating each memory area 3 are formed. Also, in the wiring layer 7, wirings for electrically connecting the magnetic element section 9 formed in the magnetic material layer 8 to the semiconductor element area such as the transistor formed in the semiconductor layer 6 are formed. The anti-diffusion layer 36 is a layer for preventing ferromagnetic material (ferromagnetic element) included in the magnetic element section 9 from diffusing into the semiconductor layer 6.

First of all, the semiconductor layer 6 will be described. The semiconductor layer 6 includes a semiconductor substrate 21, an insulating area 22, a drain area 32a and a source area 32c of the write transistor 32, and a drain area 34a and a source area 34c of the read transistor 34. The semiconductor substrate 21 is formed of, for example, a Si substrate doped with a p-type or n-type impurity. The insulating area 22 is formed in an area other than the write transistor 32 and the read transistor 34 on the semiconductor substrate 21 to electrically separate the write transistor 32 from the read transistor 34. The insulating area 22 is formed from an insulation material such as, for example, $SiO_2$.

Referring to FIG. 3, the read transistor 34 is configured of a drain area 34a and a source area 34c, which are semiconductor areas of a conductive type opposite to that of the semiconductor substrate 21, a gate electrode 34b, and a part of the semiconductor substrate 21. The drain-area 34a and the source area 34c are, for example, formed adjacent to the surface of the Si substrate being doped with an impurity of 5 conductive type opposite to that of the semiconductor substrate 21. The drain area 34a and the source area 34c are interposed by the semiconductor substrate 21 therebetween, on the semiconductor substrate 21, and the gate electrode 34b is disposed being separated therefrom. Owing to the above configuration, in the read transistor 34, when a voltage (control voltage) is applied to the gate electrode 34b, conduction is established between the drain area 34a and the source area 34c. In this embodiment, the gate electrode 34b is formed, not in the semiconductor layer 6, but in the wiring layer 7, which will be described later.

Referring to FIG. 4, the read transistor 32 is configured of a drain area 32a and a source area 32c, which are semiconductor areas of a conductive type opposite to that of the semiconductor substrate 21, a gate electrode 32b, and a part of the semiconductor substrate 21. The drain area 32a and the source area 32c are, for example, are formed adjacent to the surface of the Si substrate being doped with an impurity of conductive type opposite to that of the semiconductor substrate 21. The drain area 32a and the source area 32c are interposed by the semiconductor substrate 21 therebetween; on the semiconductor substrate 21, the gate electrode 32b is disposed being separated therefrom. Owing to the configuration as described above, in the read transistor 32, when a voltage (control voltage) is applied to the gate electrode 32b, a conduction is established between the drain area 32a and the source area 32c. In this embodiment, the gate electrode 32b is formed, not in the semiconductor layer 6, but in the wiring layer 7, which will be described later.

Figure 5:
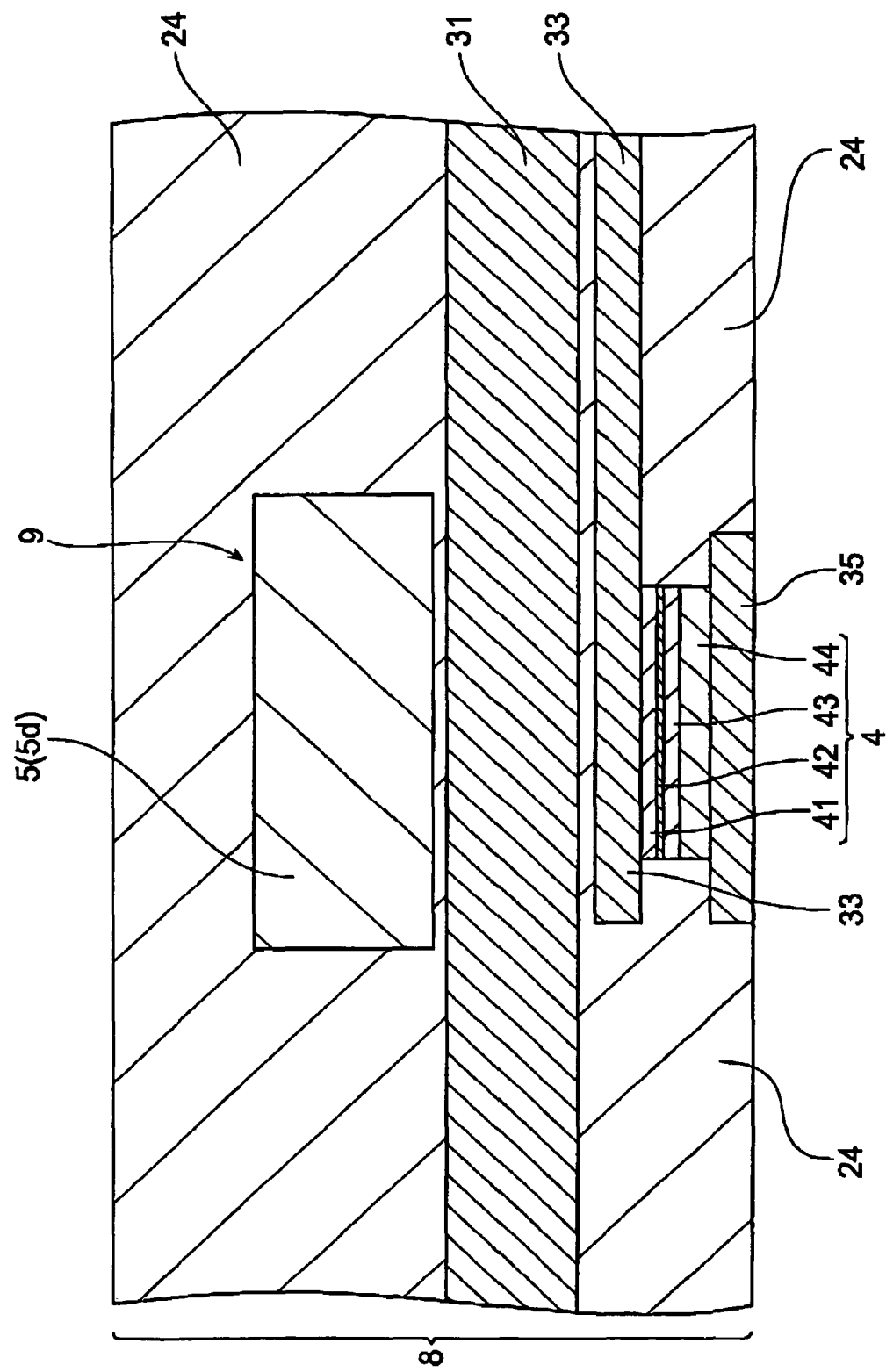
FIG. 5 is a sectional diagram of a memory area showing a TMR element and periphery structure thereof along the row direction.
Figure 6:
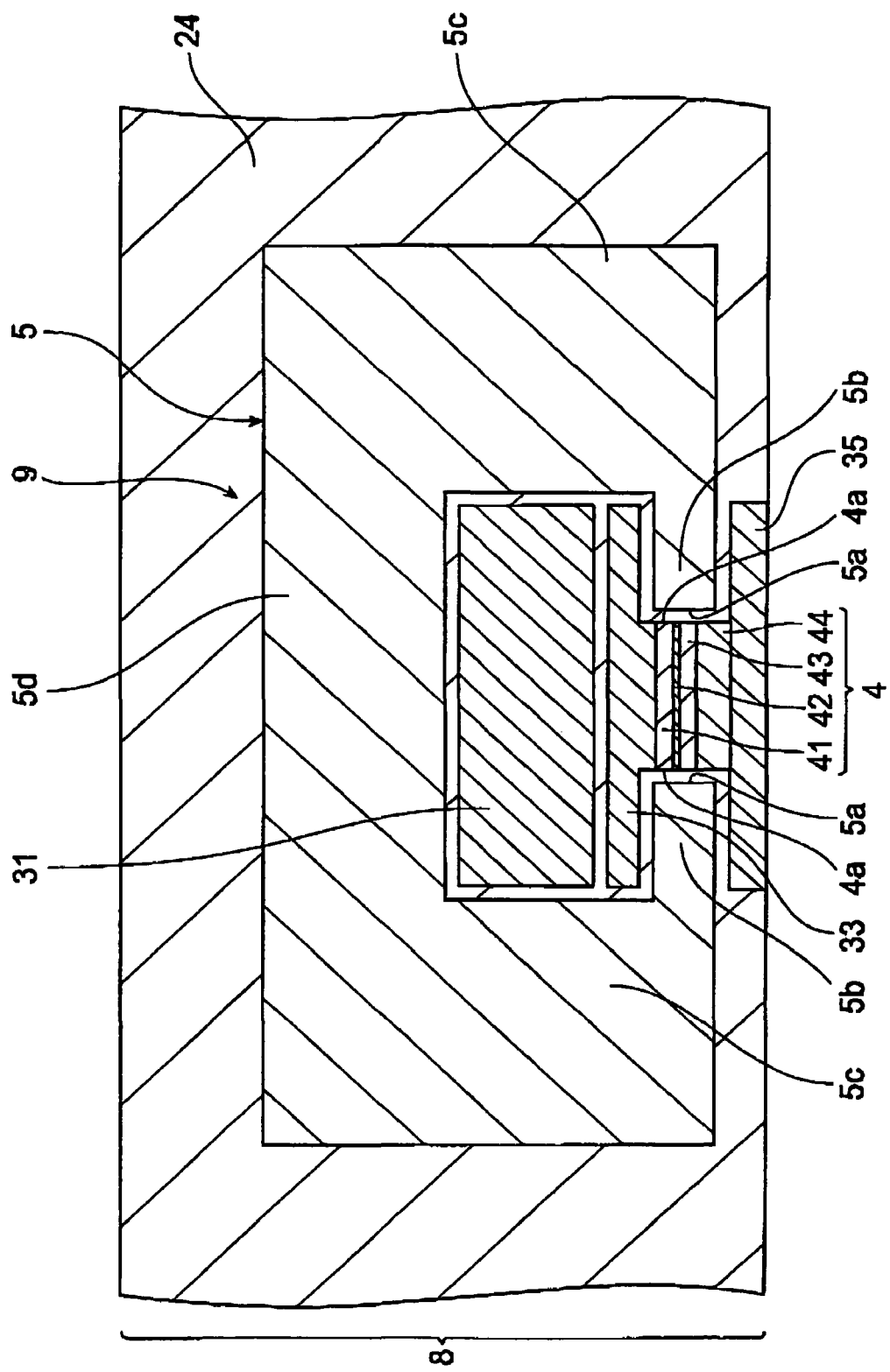
FIG. 6 is a sectional diagram of a memory area showing the TMR element and periphery structure thereof along the column direction.

Next, the magnetic material layer 8 will be described. The magnetic material layer 8 is configured including an insulating area 24 and a magnetic element section 9. The magnetic element section 9 includes the TMR element 4, the magnetic yoke 5, the write wiring 31 and the read wiring 33. In the magnetic material layer 8, the insulating area 24 occupies the area other than the magnetic element section 9 and other wirings. FIG. 5 and FIG. 6 are enlarged views of the TMR element 4 and the periphery structure thereof. FIG. 5 shows a section of the memory area 3 along the row direction; and FIG. 6 shows a section of the memory area 3 along the column direction. Referring to FIG. 5 and FIG. 6, the TMR element 4 configured of a first magnetic layer 41, a nonmagnetic insulating layer 42, a second magnetic layer 43, and an antiferromagnetic layer 44 being piled up in this order. In this embodiment, the first magnetic layer 41 is the magneto-sensitive layer and the magnetizing direction thereof changes depending on the external magnetic field from the write wiring 31; thus, binary data are recorded. As for the material of the first magnetic layer 41, for example, a ferromagnetic material such as Co, CoFe, NiFe, NiFeCo and CoPt are available.

In the second magnetic layer 43, the magnetizing direction is fixed by the antiferromagnetic layer 44. That is, owing to exchange coupling in the joint surface between the antiferromagnetic layer 44 and the second magnetic layer 43 the magnetizing direction of the second magnetic layer 43 is stabilized. The easy-to-magnetize axis direction of the second magnetic layer 43 is adapted so as to agree with the easy-to-magnetize axis direction of the first magnetic layer 41. As for the material of the second magnetic layer 43, for example, a ferromagnetic material such as Co, CoFe, NiFe, NiFeCo and CoPt may be employed. Also, as for the material of the antiferromagnetic layer 44, a material of IrMn, PtMn, FeMn, PtPdMn, NiO, or arbitrary combination thereof may be employed.

The nonmagnetic insulating layer 42 is a layer formed from a nonmagnetic and insulation material. Being interposed by the nonmagnetic insulating layer 42 between the first magnetic layer 41 and the second magnetic layer 43, tunneling magnetoresistive (TMR) is generated between the first magnetic layer 41 and the second magnetic layer 4. That is, between the first magnetic layer 41 and the second magnetic layer 43, an electrical resistance corresponding to the relative relationship (parallel or anti-parallel) between the magnetizing direction of the first magnetic layer 41 and the magnetizing direction of the second magnetic layer 43 is generated. As for the material of the nonmagnetic insulating layer 42, for example, oxide or nitride of a metal such as Al, Zn and Mg is suitable.

As the layer for stabilizing the magnetizing direction of the second magnetic layer 43, in place of the antiferromagnetic layer 44, a third magnetic layer may be formed being interposed by a non-magnetic metal layer or synthetic AF (antiferromagnetic) layer. The third magnetic layer forms an antiferromagnetic combine with the second magnetic layer 43, thereby the magnetizing direction of the second magnetic layer 43 is further stabilized. Further, the influence of magnetostatic from the second magnetic layer 43 to the first magnetic layer 41 can be prevented, and the magnetizing direction of the first magnetic layer 41 can be easily inversed. As for the material of the third magnetic layer is not particularly limited, but it is preferred to use a single ferromagnetic material such as Co, CoFe, NiFe, NiFeCo and CoPt or in combination thereof. As for the material of the non-magnetic metal layer formed between the second magnetic layer 43 and the third magnetic layer, Ru, Rh, Ir, Cu and Ag are preferable. The thickness of the non-magnetic metal layer is preferably 2 nm or less so as to obtain a strong antiferromagnetic combine between the second magnetic layer 43 and the third magnetic layer.

On the first magnetic layer 41 of the TMR element 4, the read wiring 33 is formed. The read wiring 33 is formed from a conductive metal and extends in the line direction of the memory areas 3. One end of the read wiring 33 is electrically connected to the first magnetic layer 41. The other end of the read wiring 33 is electrically connected to an electrode 17b via vertical wiring 16f (refer to FIG. 2). The antiferromagnetic layer 44 of the TMR element 4 is formed on an electrode 35 and electrically connected to the electrode 35. Owing to the above configuration, the read current can be flown from the read wiring 33 to the TMR element 4.

On the read wiring 33, the write wiring 31 is formed. Between the read wiring 33 and the write wiring 31, a gap is provided and filled with the material of the insulating area 24 to insulate therebetween. The write wiring 31 is formed of a conductive metal and extends in the line direction of the memory area 3. One end of the write wiring 31 is electrically connected to an electrode 17a via a vertical wiring 16a (refer to FIG. 2). The other end of the write wiring 31 is electrically connected to an electrode 17c via vertical wiring 16h (refer to FIG. 2). The easy-to-magnetize axis direction of the first magnetic layer 41 of the TMR element 4 is adapted so as to agree with the direction crossing the longitudinal direction of the write wiring 31 (i.e., direction crossing the direction of the write current).

The magnetic yoke 5 is a ferromagnetic member, which encloses the periphery of the write wiring 31 and efficiently provides the magnetic field generated by the write current to the TMR element 4. The magnetic yoke 5 is formed of a substantially ring-like member, which has at least a pair of open ends facing to each other being interposed by a gap of a predetermined length and is disposed so as to enclose the outer periphery of the write wiring 31 at a portion in the extending direction of the write wiring 31. Specifically, the magnetic yoke 5 of the embodiment includes a pair of opposed yokes 5b, a pair of pillar yokes 5c and a beam yoke 5d. The pair of opposed yokes 5b has a pair of end faces 5a as the pair of open ends, and are formed so as to face to each other along the easy-to-magnetize axis direction of the first magnetic layer 41. The TMR element 4 is disposed so that the a pair of side faces 4a (refer to FIG. 6) faces to a pair of end face 5a, and the easy-to-magnetize axis direction of the first magnetic layer 41 agree with the direction where the pair of end face 5a are aligned. The beam yoke 5d is formed along the face of the write wiring 31 opposite to the TMR element 4. The pair of pillar yokes 5c is formed along the side faces of the write wiring 31 respectively, and connects between one end of the pair of opposed yokes 5b at the side different from the end face 5a and the both ends of the beam yoke 5d. Owing to the above configuration, the opposed yokes 5b, the pillar yokes 5c and the beam yoke 5d enclose the outer periphery of the write wiring 31 in a portion in the extending direction of the write wiring 31 (a part on the TMR element 4).

As for the material forming the magnetic yoke 5, for example, a metal including at least one element of Ni, Fe and Co is preferred. The magnetic yoke 5 is formed so that the easy-to-magnetize axis direction thereof agrees with the easy-to-magnetize axis direction of the first magnetic layer 41 of the TMR element 4. As for the cross sectional area of the magnetic yoke 5 in the faces perpendicular to the peripheral direction of the write wiring 31, the area in the pair of end faces 5a is the smallest. Specifically, in the opposed yokes 5b, the pillar yokes 5c and the beam yoke 5d of the magnetic yoke 5, the cross sectional area of the opposed yokes 5b is the smallest. Further preferably, the cross sectional area of the opposed yokes 5b becomes smaller closer to the end faces 5a.

As for the material for the insulating area 24, same as the insulating area 22 of the semiconductor layer 6, an insulation material such as $SiO_2$ is available.

Next, the wiring layer 7 will be described. The wiling layer 7 includes an insulating area 23, bit wirings 13a and 13b, a word wiring 14, a grounding wiling 15, and a plurality of vertical wirings and horizontal wirings. In the wiring layer 7, the insulating area 23 occupies the area other than the wirings. As for the material of the insulating area 23, same as the insulating area 22 of the semiconductor layer 6, an insulation material such as $SiO_2$ is available. As for the material for the vertical wirings, for example, W is available. And as for the material for the horizontal wiring, for example, Al is available.

Referring to FIG. 2, an electrode 17a connected to one end of the write wiring 31 of the magnetic material layer 8 is electrically connected to the bit wiling 13a via the vertical wiring 16b. The electrode 35, which is electrically connected to the second magnetic layer 43 side of the TMR element 4, is electrically connected to vertical wirings 16c to 16e and horizontal wirings 18a, 18b of the wiring layer 7. The vertical wiring 16e is in ohmic contact with the drain area 34a of the read transistor 34. In the magnetic material layer 8, an electrode 17b, which is electrically connected to the first magnetic layer 41 side of the TMR element 4 via the read wiring 33, is electrically connected to the horizontal wiring 18c via vertical wiring 16g. The horizontal wiring 18c is electrically connected to the bit wiring 13a via an unshown wiling.

Referring to FIG. 3, the grounding wiring 15 is electrically connected to a vertical wiring 16n; and the vertical wiring 16n is in ohmic contact with the source area 34c of the read transistor 34. A part of the word wiring 14 serves as the gate electrode 34b of the read transistor 34. That is, the gate electrode 34b shown in FIG. 3 is formed using a part of the word wiring 14 extending in the line direction of the memory area 3. Owing to the above configuration, the word wiring 14 is electrically connected to the control terminal (gate electrode 34b) of the read transistor 34.

Referring to FIG. 4, an electrode 17e, which is connected to the other end of the write wiring 31 in the magnetic material layer 8, is electrically connected to vertical wirings 16i to 16k and horizontal wirings 18d, 18e in the wiring layer 7. The vertical wiring 16k is in ohmic contact with the drain area 32a of the write transistor 32. The horizontal wiring 18h is electrically connected to a vertical wiring 16q; and the vertical wiring 16q is in ohmic contact with the source area 32c of the write transistor 32. The horizontal wiring 18h is electrically connected to the bit wiring 13b (refer to FIG. 2) via an unshown wiring. A part of the word wiring 14 serves as the gate electrode 32b of the write transistor 32. That is, the gate electrode 32b shown in FIG. 4 is formed using a part of the word wiring 14 extending in the line direction of the memory area 3. Owing to the above configuration, the word wiring 14 is electrically connected to the control terminal (gate electrode 32b) of the write transistor 32.

Next, the anti-diffusion layer 36 will be described. The anti-diffusion layer 36 is a layer for preventing the ferromagnetic material (ferromagnetic element), which is included in the TMR element 4 of the magnetic element section 9, and the magnetic yoke 5 from diffusing into the semiconductor layer 6. In this embodiment, the anti-diffusion layer 36 is formed between the magnetic material layer 8 and the wiring layer 7. The anti-diffusion layer 36 preferably includes a material for preventing the ferromagnetic material from passing through, for example, at least one element selected from a group consisnting of Ti and Ru. The anti-diffusion layer 36 is disposed at least between the magnetic material layer 8 and the semiconductor layer 6. For example, the anti-diffusion layer 36 may be disposed between the wiring layer 7 and the semiconductor layer 6 or within the wiring layer 7. In this embodiment, the electrodes 17a to 17c are positioned at the magnetic material layer 8 side with respect to the anti-diffusion layer 36. However, the electrodes 17a to 17c may be positioned at the wiring layer 7 side with respect to the anti-diffusion layer 36.

Figure 7A:
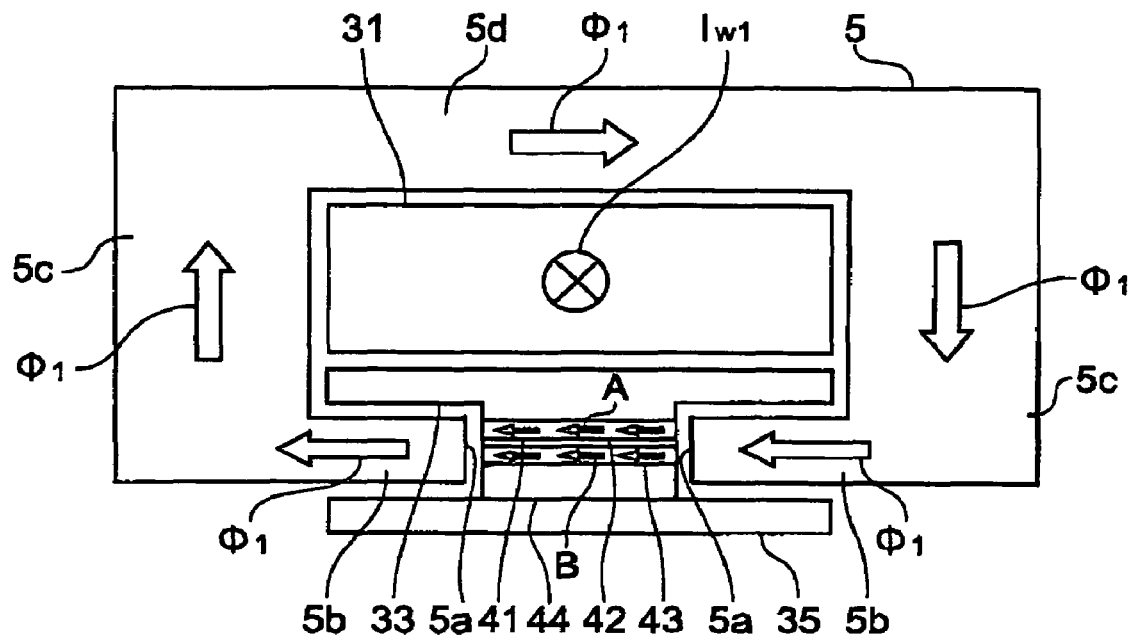
FIG. 7A is a diagram showing the operation in the periphery of the TMR element in the memory area.

Referring to FIG. 7A, FIG. 7B, FIG. 8A and FIG. 8B, the operation of the TMR element 4 and the periphery thereof in the memory area 3 of this embodiment will be described. As shown in FIG. 7A, when a negative write current $I_{w1}$ flows through the write wiring 31, a magnetic field $\Phi_1$ is generated around the write wiring 31 in the peripheral direction of the write wiring 31. The magnetic field $\Phi_1$ forms a closed path, which goes through the inside of the magnetic yoke 5 formed around the write wiring 31 and the gap between the pair of end faces 5a. In this embodiment, in the opposed yokes 5b, the pillar yokes 5c and the beam yoke 5d of the magnetic yoke 5, the cross sectional area of the opposed yokes 5b is the smallest. Accordingly, the magnetic flux density of the magnetic field $\Phi_1$ formed inside the magnetic yoke 5 is the largest at the opposed yokes 5b.

When the magnetic field $\Phi_1$ is generated around the write wiring 31, owing to the magnetic field enclosing effect in the magnetic yoke 5, the magnetic field $\Phi_1$ (external magnetic field) is efficiently provided to the first magnetic layer 41 of the TMR element 4. Owing to the magnetic field $\Phi_1$, the magnetizing direction A of the first magnetic layer 41 is oriented to the same direction as that of the magnetic field $\Phi_1$. Here, owing to the exchange coupling with the antiferromagnetic layer 44, when the magnetizing direction B of the second magnetic layer 43 is previously oriented to the same direction as that of the magnetic field $\Phi_1$, the magnetizing direction A of the first magnetic layer 41 and the magnetizing direction B of the second magnetic layer 43 are oriented to the same direction; i.e., parallel to each other. Thus, one of the binary data (for example 0) is written in the TMR element 4.

Figure 7B:
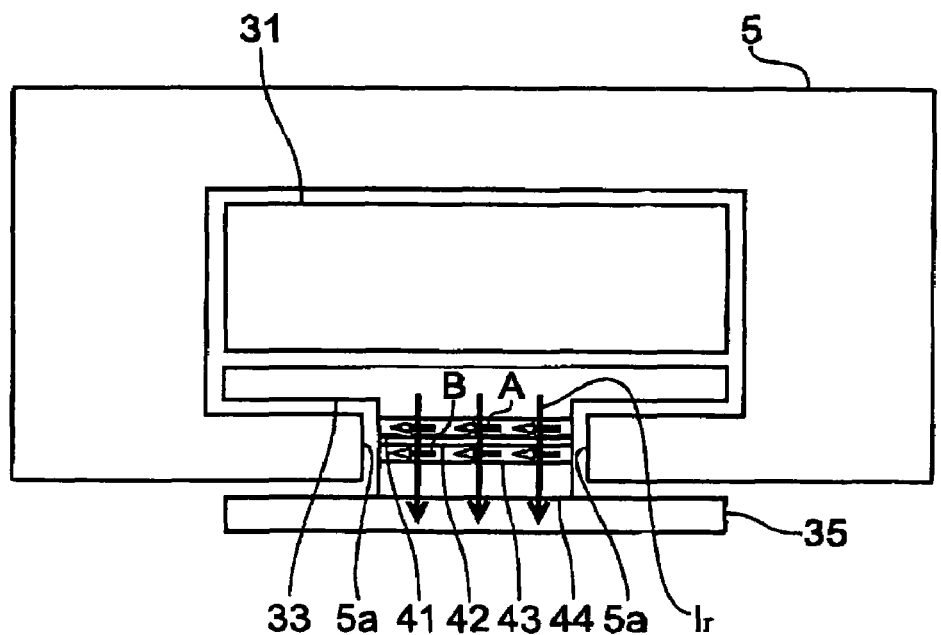
FIG. 7B is a diagram showing the operation in the periphery of the TMR element in the memory area.

When reading out the binary data written in the TMR element 4, as shown in FIG. 7B, a read current Ir is flown between the read wiring 33 and the electrode 35, and a change in current value is detected. Or a change of the potential difference between the read wiring 33 and the electrode 35 is detected. Owing to this, it is possible to determine which of the binary data the TMR element 4 records (i.e., whether the magnetizing direction A in the first magnetic layer 41 is parallel or anti-parallel with the magnetizing direction B in the second magnetic layer 43). For example, when the magnetizing direction A in the first magnetic layer 41 is parallel with the magnetizing direction B in the second magnetic layer 43, owing to the tunneling magnetoresistive (TMR) effect in the nonmagnetic insulating layer 42, the resistant value between the first magnetic layer 41 and the second magnetic layer 43 is relatively small. Accordingly, assuming that, for example, the read current Ir is constant, the potential difference between the read wiring 33 and the electrode 35 is relatively small, it is determined that the TMR element 4 is written with 0 as the binary data.

Figure 8A:
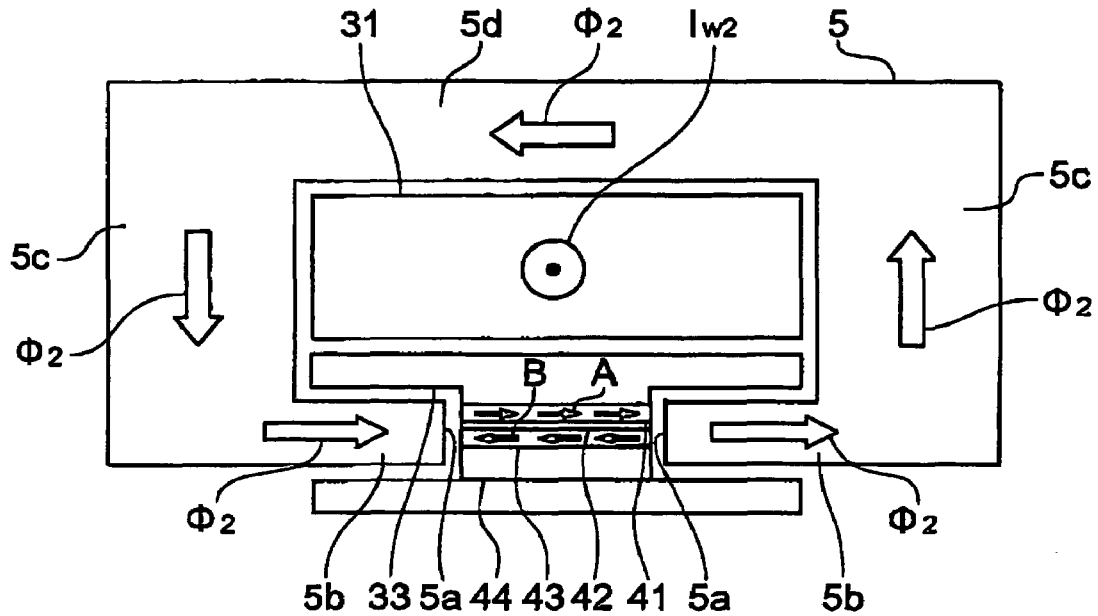
FIG. 8A is a diagram showing the operation in the periphery of the TMR element in the memory area.

Also, as shown in FIG. 8A, when a positive write current $I_{w2}$ flows through the write wiring 31, a magnetic field $\Phi_2$, of which direction is the opposite to that of the magnetic field $\Phi_1$, is generated around the write wiring 31. The magnetic field $\Phi_2$ forms a closed path, which goes through the inside of the magnetic yoke 5 and the gap between the pair of end faces 5a. Same as the case of the magnetic field $\Phi_1$, the magnetic flux density of the magnetic field $\Phi_2$ formed inside the magnetic yoke 5 is the largest at the opposed yokes 5b.

When the magnetic field $\Phi_2$ is generated around the write wiring 31, owing to the magnetic field enclosing effect of the magnetic yoke 5, the magnetic field $\Phi_2$ (external magnetic field) is efficiently provided to the first magnetic layer 41 of the TMR element 4. Owing to the magnetic field $\Phi_2$, the magnetizing direction A of the first magnetic layer 41 is oriented to the same direction as that of the magnetic field $\Phi_2$. Here, when the magnetizing direction B of the second magnetic layer 43 is oriented to the direction opposite to that of the magnetic field $\Phi_2$, the magnetizing direction A in the first magnetic layer 41 and the magnetizing direction B in the second magnetic layer 43 are opposite to each other i.e., anti-parallel with each other. Thus, the TMR element 4 is written with the other one of the binary data (for example, 1).

Figure 8B:
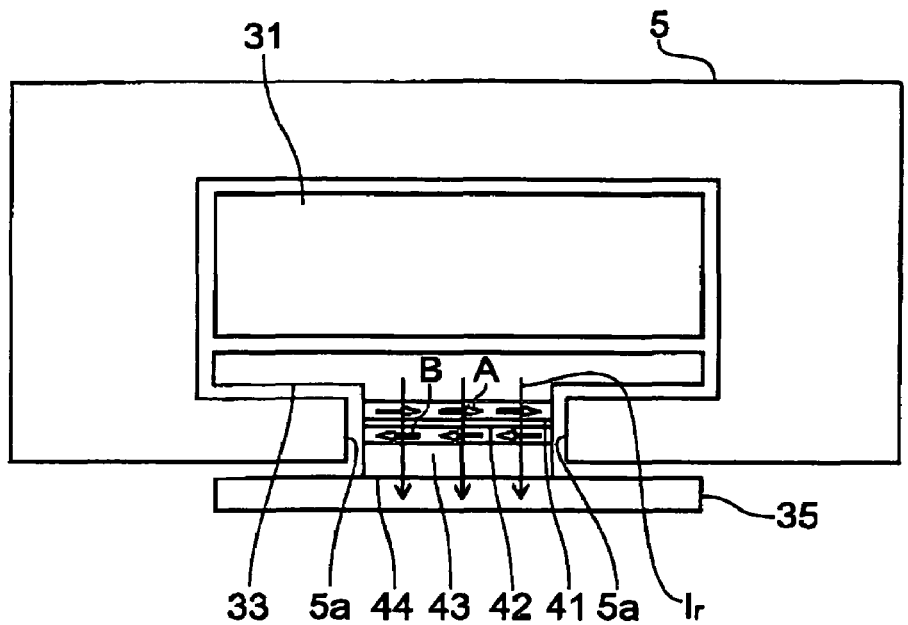
FIG. 8B is a diagram showing the operation in the periphery of the TMR element in the memory area.

When the magnetizing direction A in the first magnetic layer 41 is anti-parallel with the magnetizing direction B in the second magnetic layer 43, owing to the tunneling magnetoresistive (TMR) effect in the nonmagnetic insulating layer 42, the resistant value between the first magnetic layer 41 and the second magnetic layer 43 is relatively large. Accordingly, for example, as shown in FIG. 8B, when a specific read current Ir is flown between the read wiring 33 and the electrode 35, the potential difference between the read wiring 33 and the electrode 35 is relatively large. Therefore, it is determined that TMR element 4 is written with 1 as the binary data.

The effect, which is provided by the magnetic memory 1 according to the above-described embodiment, will be described. In the magnetic memory 1 of the embodiment, between the magnetic material layer 8, which includes the TMR element 4, and the semiconductor layer 6, which includes the write transistor 32, the wiring layer 7, which includes bit wirings 13a and 13b corresponding to the each column of the memory areas 3 and the word wiring 14 corresponding to each row, is formed. As described above, by sandwiching a layer (wiring layer 7) between the layer (magnetic material layer 8) including the TMR element 4 and the layer (semiconductor layer 6) including the write transistor 32, the ferromagnetic material diffused from the TMR element 4 hardly reaches to the semiconductor layer 6. Accordingly, the diffusion of the ferromagnetic material into the drain area 32a and the source area 32c of the write transistor 32 is reduced. Also, as described later, in the magnetic memory 1 of the embodiment, the process forming the magnetic material layer 8 and the process forming the wiring layer 7 and the semiconductor layer 6 can be separated from each other. Owing to this, the TMR element 4 can be formed in a state that the wiring layer 7 protects the write transistor 32. Accordingly, in the manufacturing process, the ferromagnetic material is prevented from mixing into the drain area 32a and the source area 32c of the write transistor 32.

Figure 39A:
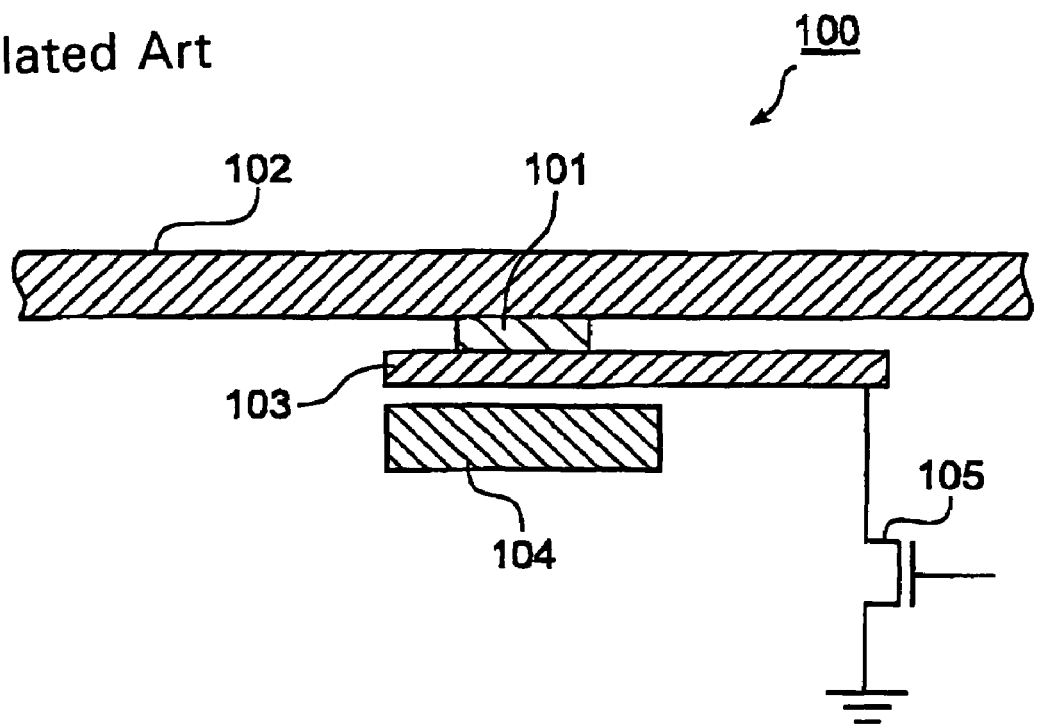
FIG. 39A is a side sectional view showing an example of a structure of a memory area in a conventional MRAM.
Figure 39B:
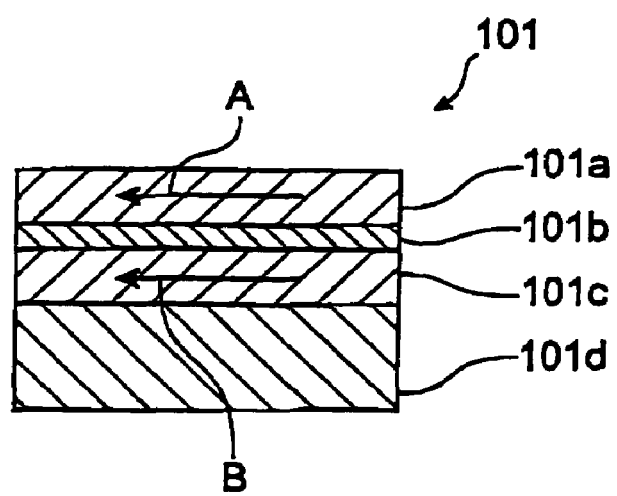
FIG. 39B is a sectional diagram showing a structure of a TMR element.

The above-described magnetic memory 1 can be achieved by providing the write transistor 32 to each memory area 3. That is, unlike the conventional magnetic memory 100 shown in FIG. 39A, by disposing the write transistor 32 to each memory area 3, the write wiring 31, which provides the external magnetic fields $\Phi_1$ and $\Phi_2$ to the TMR element 4, can be disposed independently to each memory area 3. Accordingly, bit wirings 13a, 13b, which are provided for the plurality of memory areas 3, can be formed being separated from the magnetic material layer 8. Thus, the magnetic material layer 8, the wiring layer 7 and the semiconductor layer 6 can be separated from each other.

In the magnetic memory 1 of the embodiment, it is preferred that, between the magnetic material layer 8 and the semiconductor layer 6, the anti-diffusion layer 36, which prevents the element included in the TMR element 4 from diffusing into the semiconductor layer 6, is formed. Owing to this, it is possible to reduce the diffusion of the ferromagnetic material into the drain area 32a and the source area 32c more effectively. And it is possible more effectively to prevent the ferromagnetic material from mixing into the drain area 32a and the source area 32c in the manufacturing process.

Like this embodiment, it is preferred that the read wiring 33, which is provided to each of the plurality of memory areas 3 and electrically connected to the TMR element 4 to flow the read current Ir through the TMR element 4, is included in the magnetic material layer 8. And in each of the plurality of memory areas 3, it is preferred that the drain area 34a and the source area 34c constituting the read transistor 34, which controls the conduction of the read current Ir, are included in the semiconductor layer 6. Owing to this, the binary data stored in the TMR element 4 can be appropriately read out. Also, in the magnetic memory 1, since the wiring layer 7 is sandwiched between the semiconductor layer 6 and the magnetic material layer 8, it is possible to reduce the diffusion of the ferromagnetic material into the drain area 34a and the source area 34c. Further in the manufacturing process, it is possible to prevent the ferromagnetic material from mixing into the drain area 34a and the source area 34c.

Further, like this embodiment, the magnetic yoke 5 is preferably formed of a ring-like member, which has at least a pair of open ends (end faces 5a) opposing being interposed by a gap of a predetermined length, and disposed so as to enclose the outer periphery of the write wiring 31 at a portion in the extending direction thereof. Owing to this, in the magnetic fields due to the write currents $I_{w1}$ and $I_{w2}$, the magnetic field, which is emitted in the direction away from TMR element 4 can be reduced. Further, the magnetic yoke 5 has a pair of end faces 5a each facing to a pair of side faces 4a of the TMR element 4. Accordingly, the magnetic fields $\Phi_1$ and $\Phi_2$ inside the magnetic yoke 5, which forms a path closed in the peripheral direction, can be efficiently provided to the first magnetic layer 41 of the TMR element 4. Thus, according to the magnetic memory 1 of the embodiment, the magnetic fields $\Phi_1$ and $\Phi_2$ due to the write currents $I_{w1}$ and $I_{w2}$ can be provided efficiently to the TMR element 4. Accordingly, the magnetizing direction A in the first magnetic layer 41 of the TMR element 4 can be inverted using small write currents $I_{w1}$ and $I_{w2}$.

Further, according to the magnetic memory 1 of the embodiment, owing to the above-described effect of the magnetic yoke 5, the magnetizing direction A of the first magnetic layer 41 can be inverted using small write currents $I_{w1}$ and $I_{w2}$. The write transistor 32 for controlling the conduction of the write currents $I_{w1}$ and $I_{w2}$ can be miniaturized. Accordingly, the write transistor 32 can be easily disposed to each memory area 3.

Like this embodiment, the easy-to-magnetize axis direction of the magnetic yoke 5 preferably agrees with the easy-to-magnetize axis direction of the first magnetic layer 41. Also, it is preferred that the area of the section perpendicular to the peripheral direction in the magnetic yoke 5 is the smallest at the pair of end faces 5a. Owing to this, the magnetic fields $\Phi_1$ and $\Phi_2$ inside the magnetic yoke 5 can be given to the first magnetic layer 41 of the TMR element 4 more efficiently.

Next, an example of the manufacturing method of the magnetic memory 1 according to the embodiment will be described. First of all, referring to FIG. 9 to FIG. 26, the forming process of the semiconductor layer and the wiring layer will be described. And then, referring to FIG. 27 to FIG. 37, the forming process of the magnetic material layer will be described. Each of FIG. 9 to FIG. 37 shows a section along the line I-I and II-II in FIG. 2 to illustrate the mamufacturing process sequentially.

Figure 9:
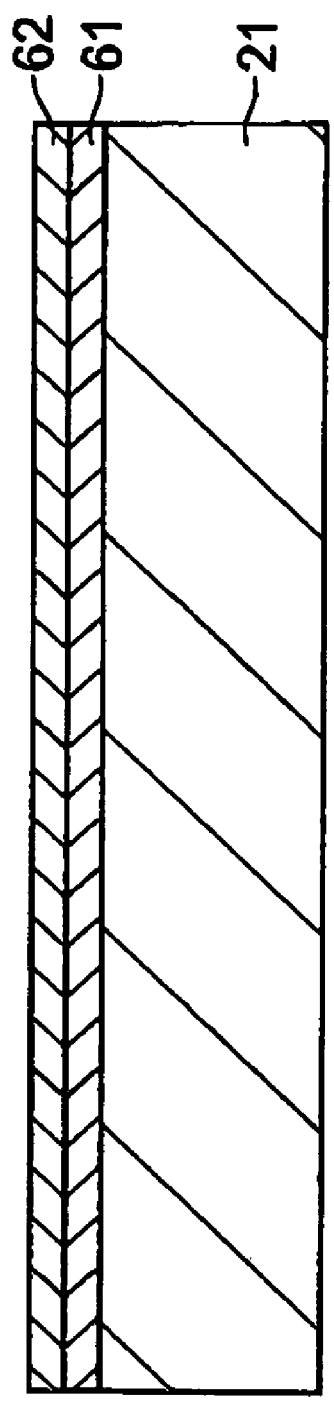
FIG. 9 is a diagram showing the mamufacturing process of a semiconductor layer.
Figure 10:
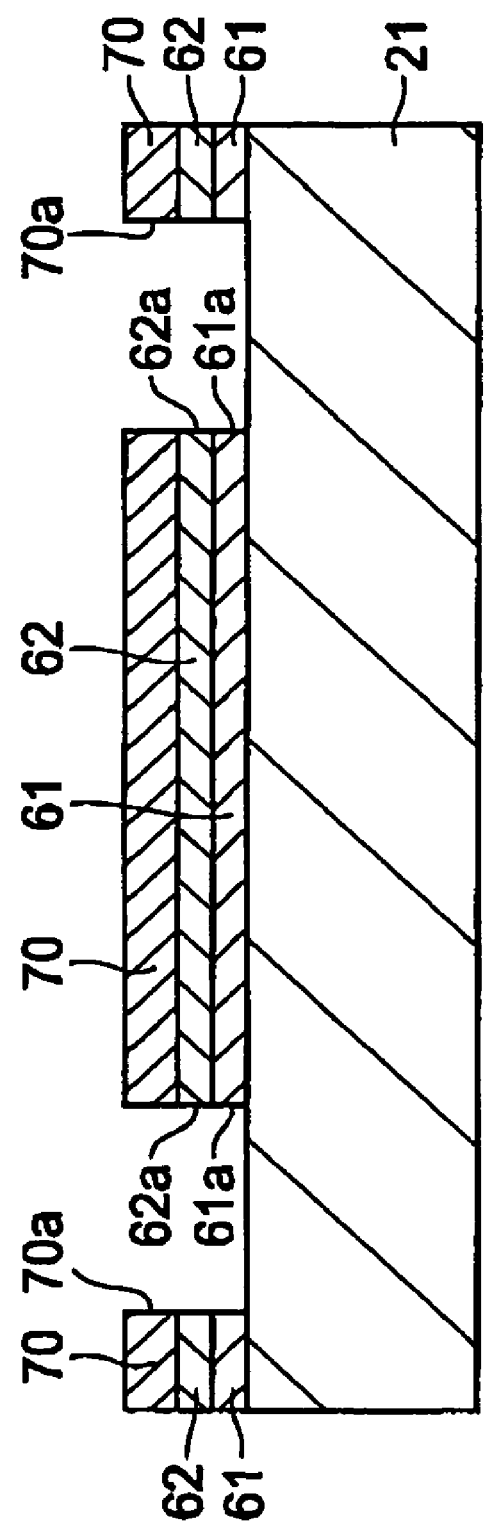
FIG. 10 is a diagram showing the mamufacturing process of the semiconductor layer.

First of all, as shown in FIG. 9, a P-type silicon substrate is prepared as the semiconductor substrate 21. On the semiconductor substrate 21, a $SiO_2$ film 61 is formed in a manner of thermal oxidation method. On the $SiO_2$ film 61, a $Si_3N_4$ film 62 is formed in a manner of thermal CVD using, for example, SiH and $NH_3$ as the material gas. Then, in order to form an active area (LOCOS) of the write transistor 32 and the read transistor 34, a resist mask 70 having an opening 70a is formed in a manner of photolithography, and then, in the $SiO_2$ film 61 and the $Si_3N_4$ film 62, openings 61a and 62a are formed (patterning) in a manner of reactive ion etching (RIE) (refer to FIG. 10).

Figure 11:
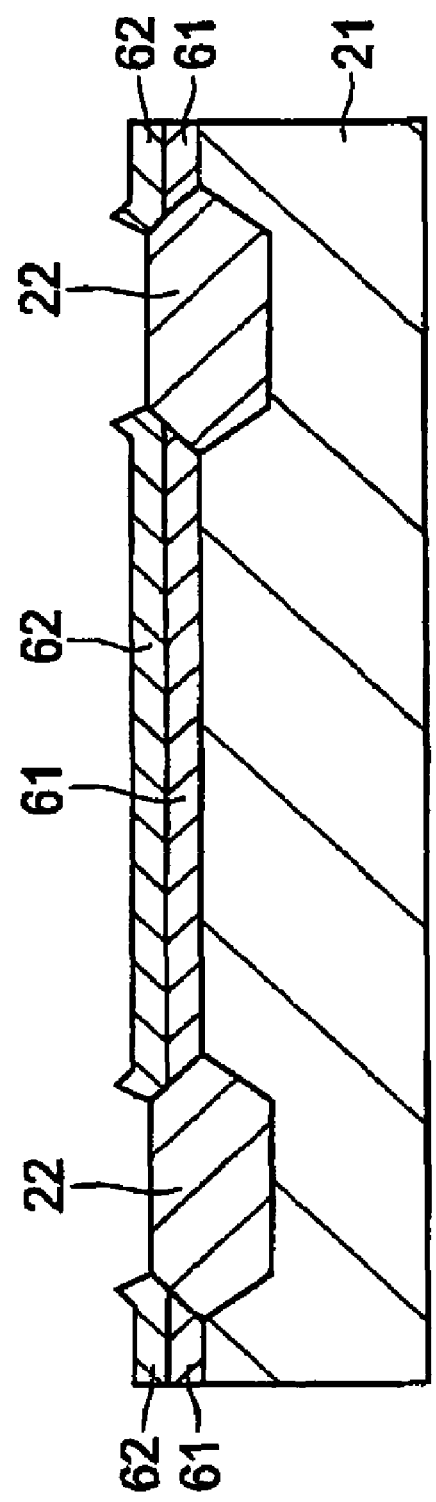
FIG. 11 is a diagram showing the mamufacturing process of a semiconductor layer.

Then, after removing the resist mask 70, as shown in FIG. 11, using the $Si_3N_4$ film 62 as a mask, the exposed portion of the $SiO_2$ film 61 is oxidized in a manner of thermal oxidation method. Thus, the field oxide film (i.e., insulating area 22) of $SiO_2$ is formed. After that, the $SiO_2$ film 61 and the $Si_3N_4$ film 62 are removed in a manner of wet etching.

Figure 12:
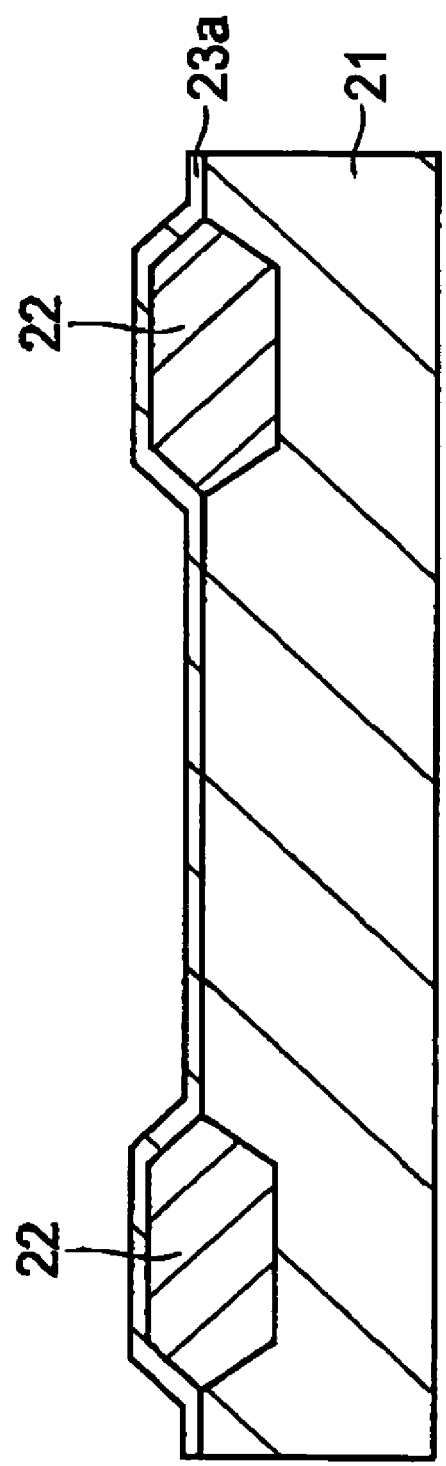
FIG. 12 is a diagram showing the mamufacturing process of a semiconductor layer.
Figure 13:
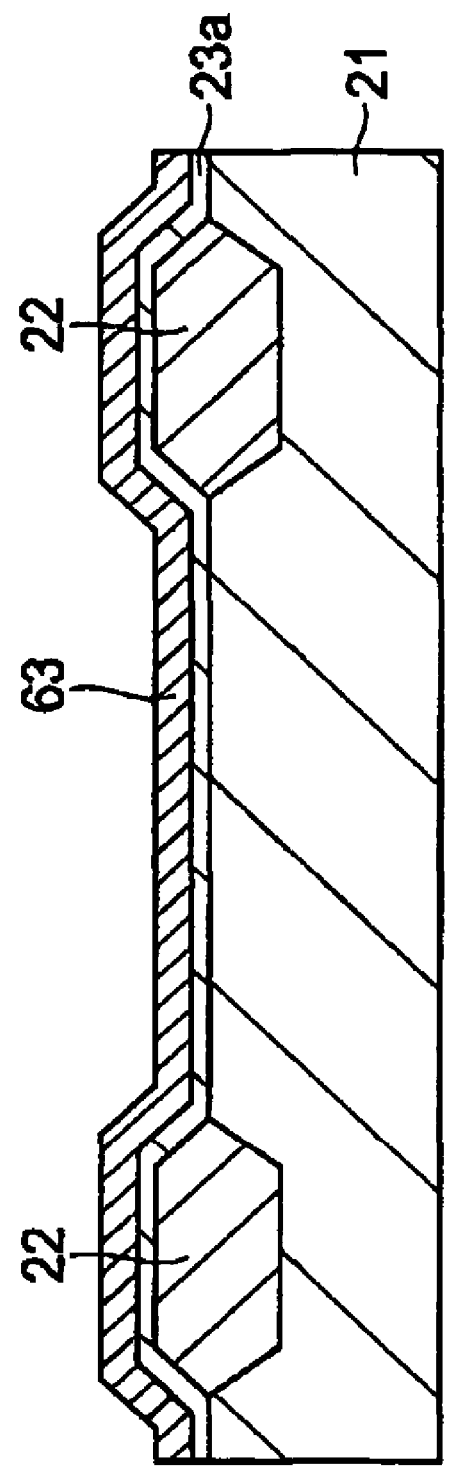
FIG. 13 is a diagram showing the mamufacturing process of a semiconductor layer.
Figure 14:
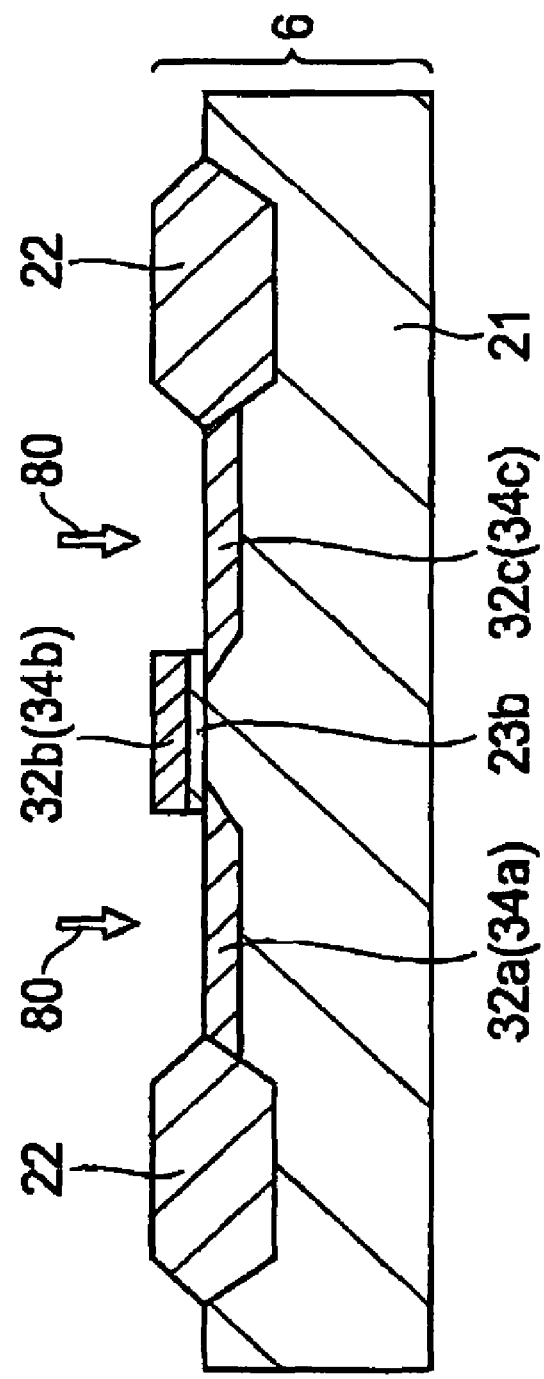
FIG. 14 is a diagram showing the mamufacturing process of a semiconductor layer.

Then, as shown in FIG. 12, on the semiconductor substrate 21 and the insulating area 22, the gate insulation film 23a of $SiO_2$ is formed thinly in a manner of thermal oxidation method. As shown in FIG. 13, on the gate insulation film 23a, a polycrystalline silicon film 63 is formed. Here, the polycrystalline silicon film 63 is formed in a manner of thermal CVD using, for example, SiH and $N_2$ as the material gas. After that, as shown in FIG. 14, a resist mask having a gate electrode pattern is formed on the polycrystalline silicon film 63, and the polycrystalline silicon film 63 is subjected to an etching in a manner of RIE to form the gate electrode 32b (34b). In the case where the gate electrode 32b (34b) is formed as a part of the word wiring 14 (refer to FIG. 2 to FIG. 4), a resist mask having a word wiring pattern is formed on the polycrystalline silicon film 63; and then, the polycrystalline silicon film 63 is subjected to an etching in a manner of RIE to form the word wiring 14. The portion other than the portion between the gate electrode 32b (34b) and the semiconductor substrate 21 in the gate insulation film 238 is subjected to RIE using the gate electrode 32b (34b) as the mask to remove therefrom. The gate insulation film 23a formed as described above becomes a part of the insulating area 23 (refer to FIG. 2 to FIG. 4). Then, ion 80 (for example As) is injected into the semiconductor substrate 21 using the gate electrode 32b (34b) as the mask; thereby, the $n^+$-type drain area 32a (34a), and the source area 32c (34c) are formed with respect to the gate electrode 32b (34b) in a self-aligning manner. Thus, the semiconductor layer 6 is completed.

Figure 15:
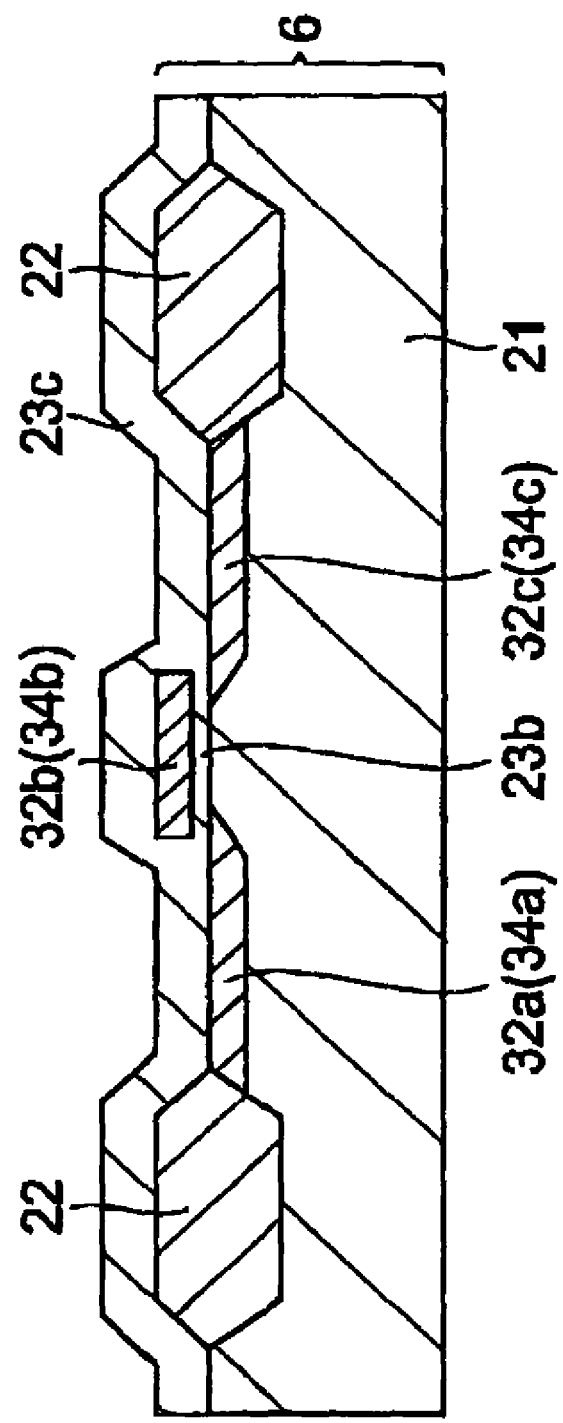
FIG. 15 is a diagram showing the mamufacturing process of a wiring layer.
Figure 16:
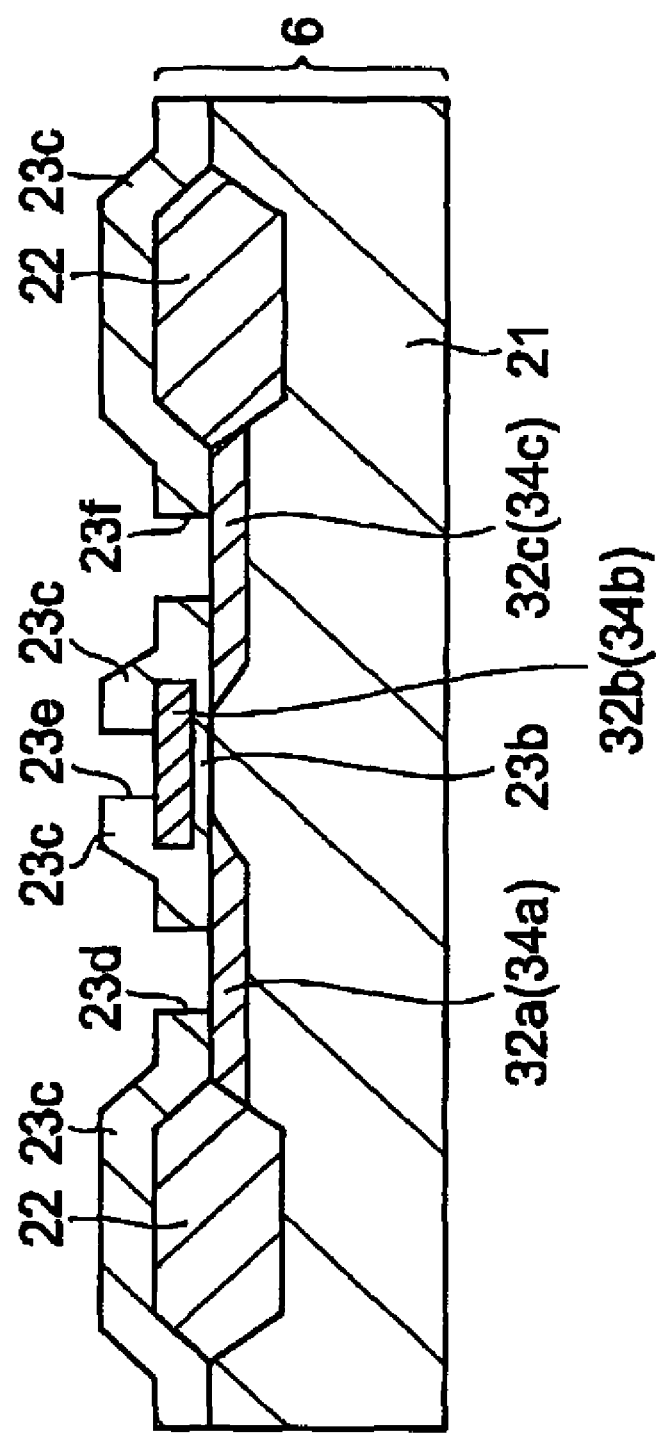
FIG. 16 is a diagram showing the mamufacturing process of the wiring layer.

Then, as shown in FIG. 15, the interlayer insulation film 23c of $SiO_2$ is formed all over the semiconductor substrate 21 in a manner of CVD using, for example, SiH and $O_2$ as the material gas. The interlayer insulation film 23c also becomes a part of the insulating area 23. In order to form contact holes for pulling out the corresponding electrodes of the drain area 32a (34a), the gate electrode 32b (34b), and the source area 32c (34c) respectively, as shown in FIG. 16, contact holes 23d to 23f are formed in the interlayer insulation film 23c. Here, a resist pattern having openings corresponding to the position and the configuration of the contact holes 23d to 23f is formed on the interlayer insulation film 23c, and the interlayer insulation film 23c is subjected to RIE to form the contact holes 23d to 23f.

Figure 17:
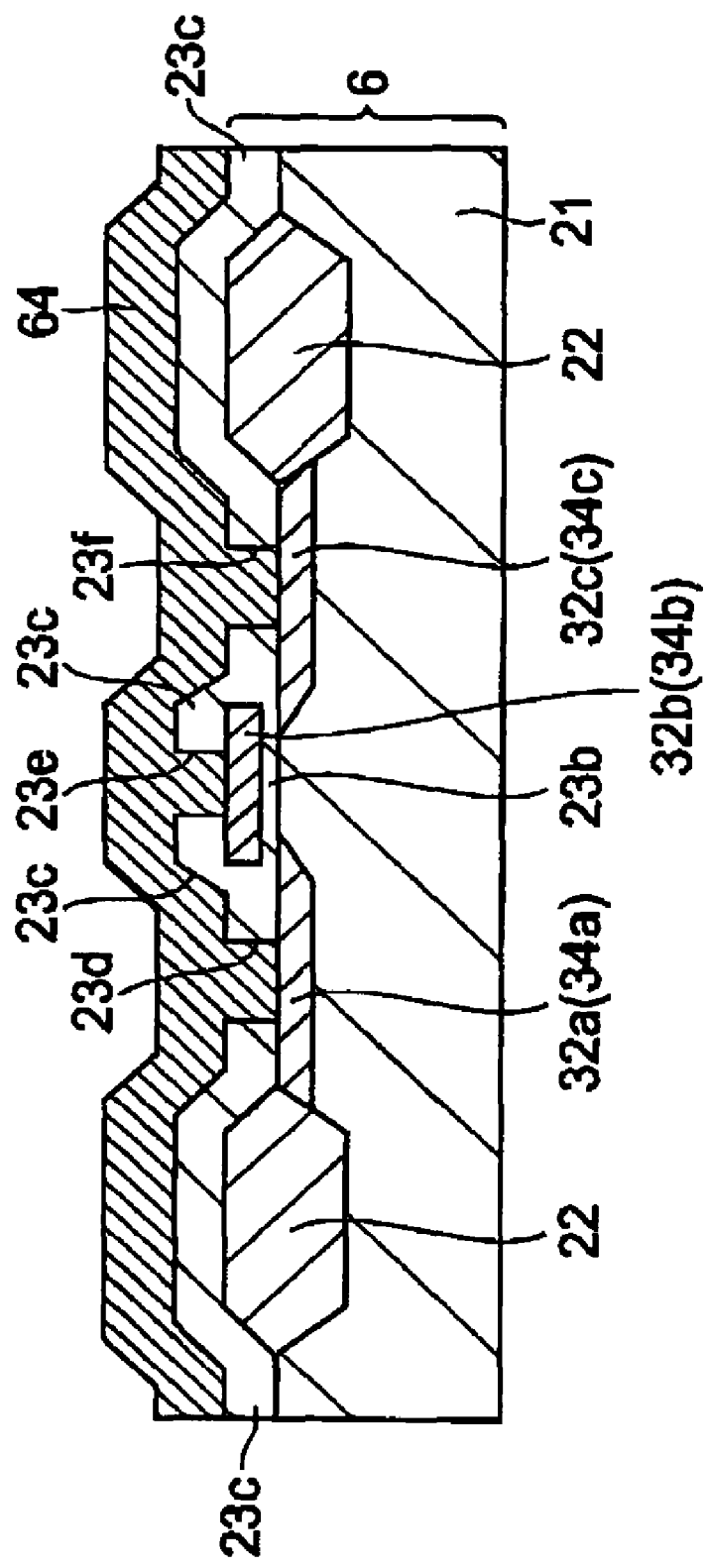
FIG. 17 is a diagram showing the mamufacturing process of the wiring layer.
Figure 18:
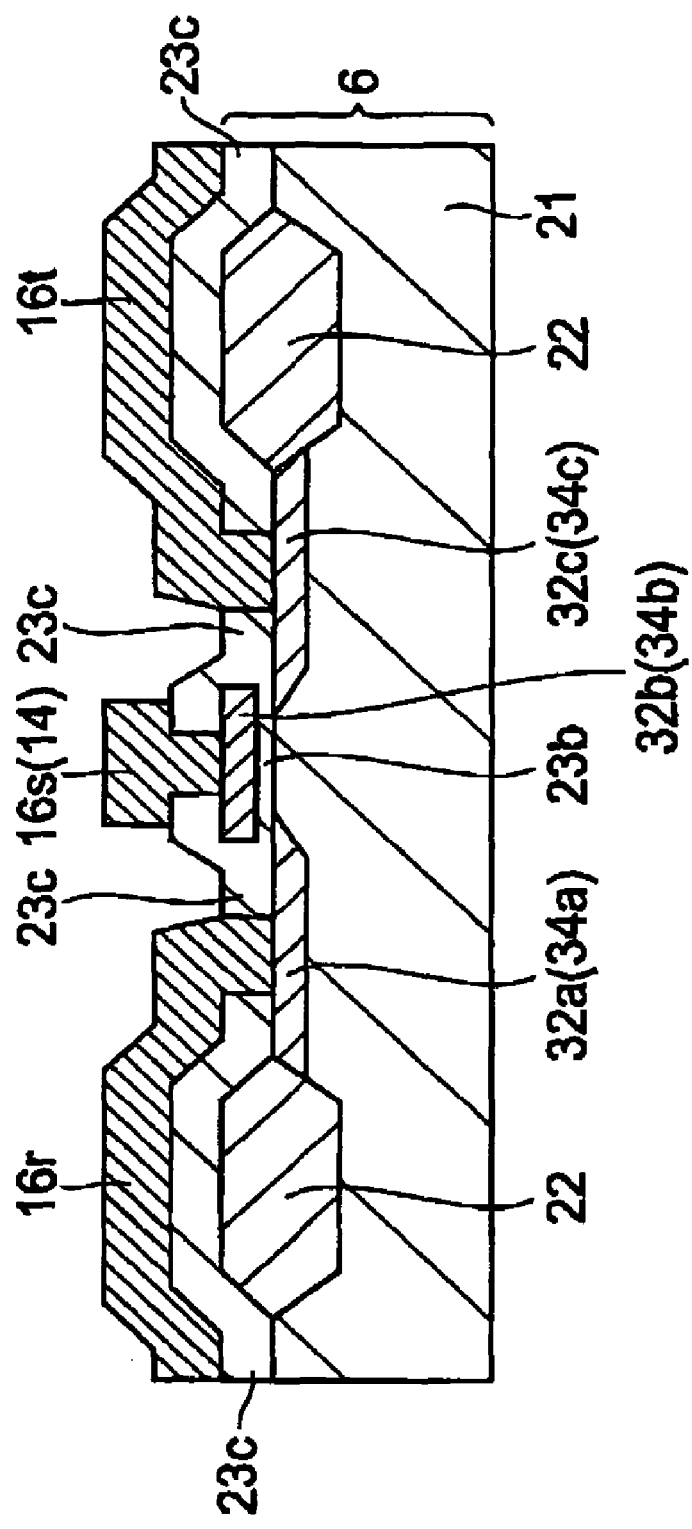
FIG. 18 is a diagram showing the mamufacturing process of the wiring layer.

Then, as shown in FIG. 17, on the interlayer insulation film 23c and inside the contact holes 23d to 23f, an Al film 64 is formed in a manner of sputtering. Then, as shown in FIG. 18, the Al film 64 is subjected to an etching (RIE) using a resist mask of a predetermined pattern. Thereby, a wiring 16r electrically connected to the drain area 32a (34a), a wiring 16s electrically connected to the gate electrode 32b (34b) and a wiring 16t electrically connected to the source area 32c (34c) are formed. In this manufacturing method, wirings 16r to 16t serve as both of the vertical wiring and the horizontal wiring. Needless to say, as shown in FIG. 2 to FIG. 4, the vertical wiring portion and the horizontal wiring portion may be formed using different materials (in different process). If necessarily, the wirings 16r to 16t may be omitted. In particular, in the case where the gate electrode 32b (34b) is commonly used as the word wiring 14 (refer to FIG. 1), the wiring 16s electrically connected to the gate electrode 32b (34b) is not necessary. Contrarily, in the case where gate electrode 32b (34b) is not used as the word wiring 14, the wiring 16s may be used as the word wiring 14.

Figure 19:
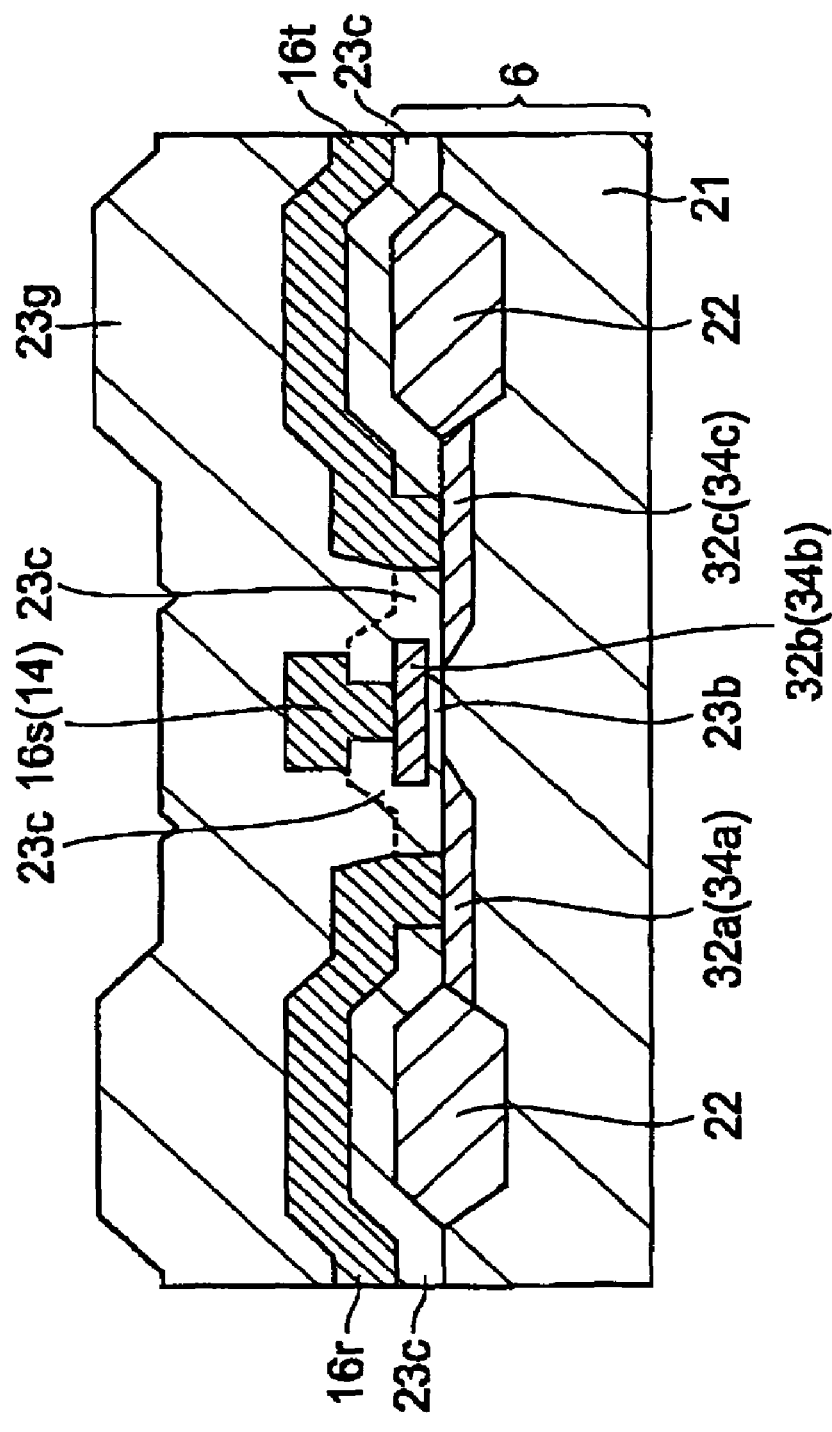
FIG. 19 is a diagram showing the mamufacturing process of the wiring layer.
Figure 20:
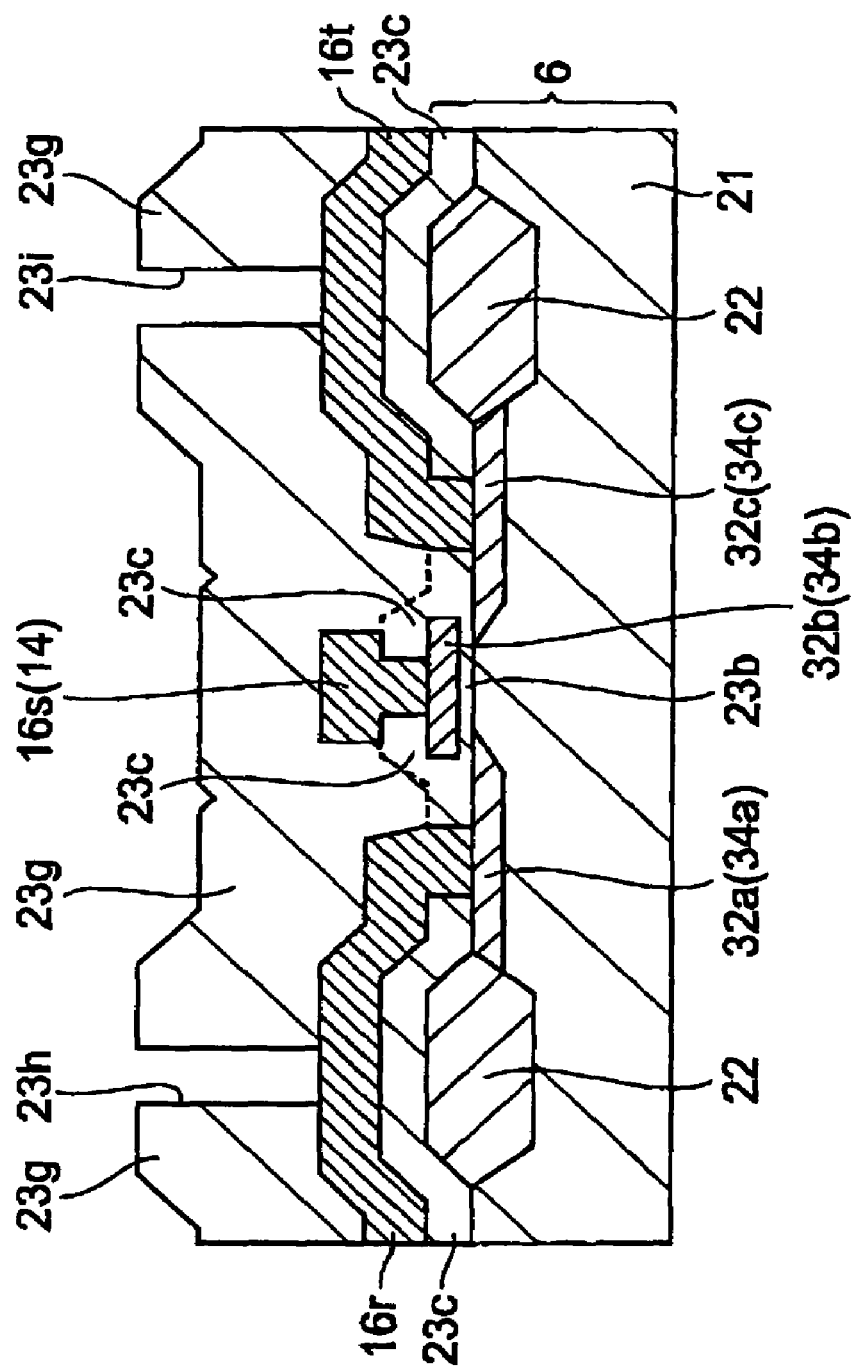
FIG. 20 is a diagram showing the mamufacturing process of the wiring layer.
Figure 21:
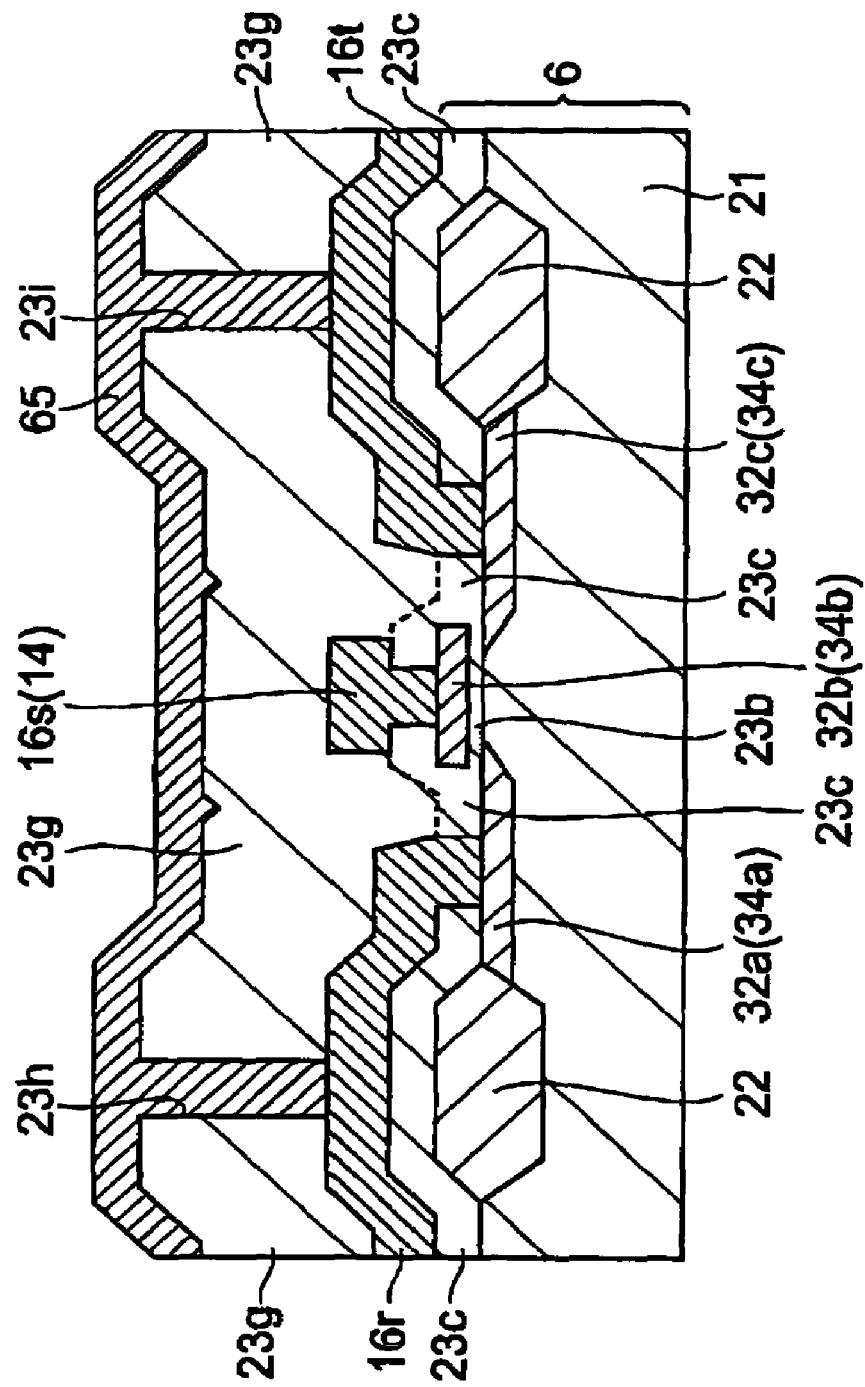
FIG. 21 is a diagram showing the mamufacturing process of the wiring layer.
Figure 22:
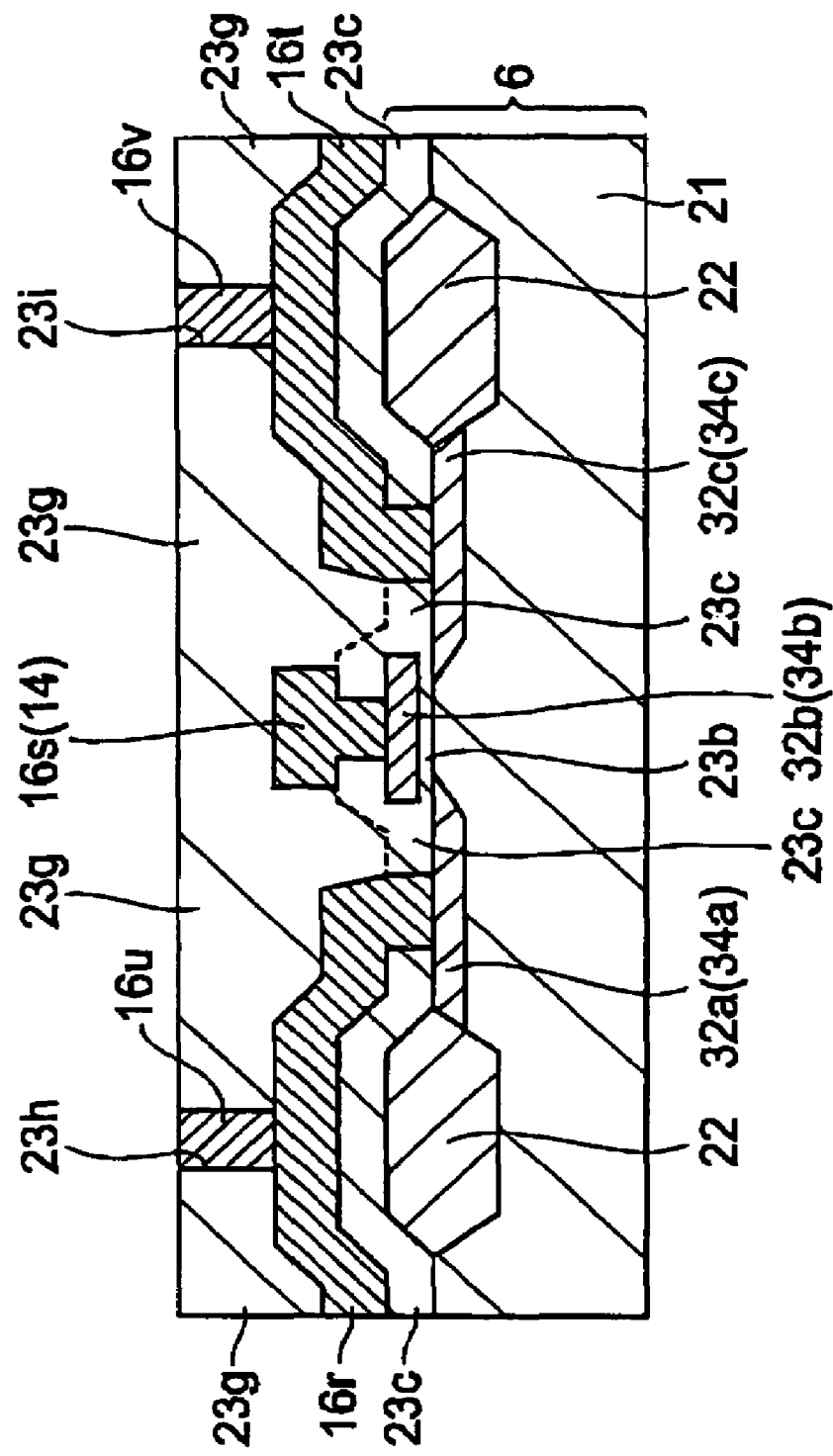
FIG. 22 is a diagram showing the mamufacturing process of the wiring layer.

Then, in a manner of CVD using, for example, SiH and $O_2$ as the material gas, an interlayer insulation film 23g of $SiO_2$ is formed all over the semiconductor substrate 21 as shown in FIG. 19. The interlayer insulation film 23g also becomes a part of the insulating area 23. As shown in FIG. 20, after forming a resist pattern having openings at a position forming a vertical wiring on the interlayer insulation film 23g, holes 23h and 23i are formed in the interlayer insulation film 23g by subjecting the interlayer insulation film 23g to an etching (RIE). Then, as shown in FIG. 21, a W film 65 is formed on the interlayer insulation film 23g and inside the holes 23h and 23i in a manner of CVD. Then, as shown in FIG. 22, the W film 65 formed in an area other than the holes 23h and 23i is removed in a manner of chemical mechanical polishing (CMP) to flatten the surface of the interlayer insulation film 23g. Thus, the vertical wirings 16u and 16v are formed. These vertical wirings 16u and 16v are an example of vertical wirings in FIG. 2 to FIG. 4. The vertical wiring may be formed in a predetermined portion using the above-described manufacturing method.

Figure 23:
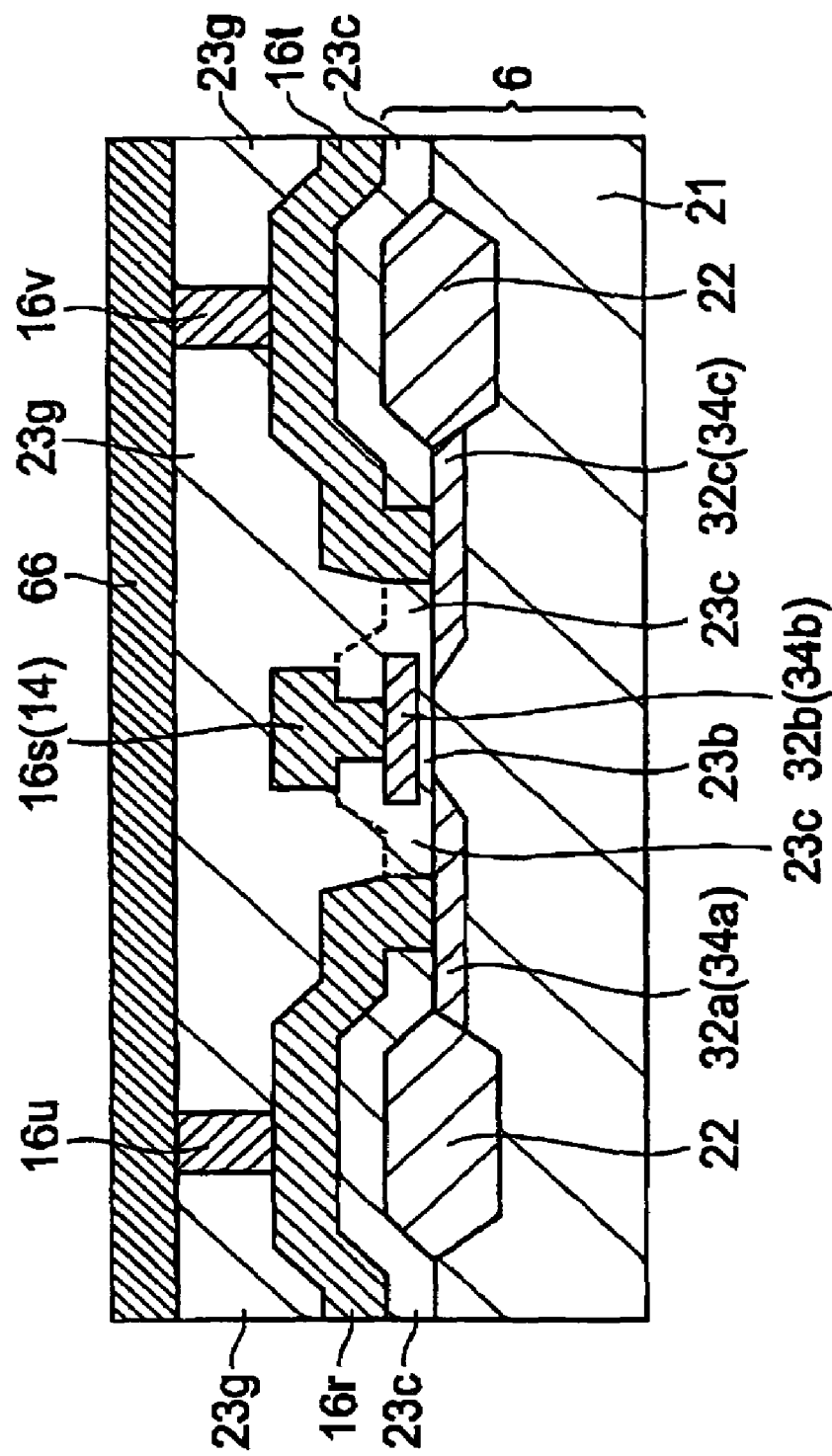
FIG. 23 is a diagram showing the mamufacturing process of the wiring layer.
Figure 24:
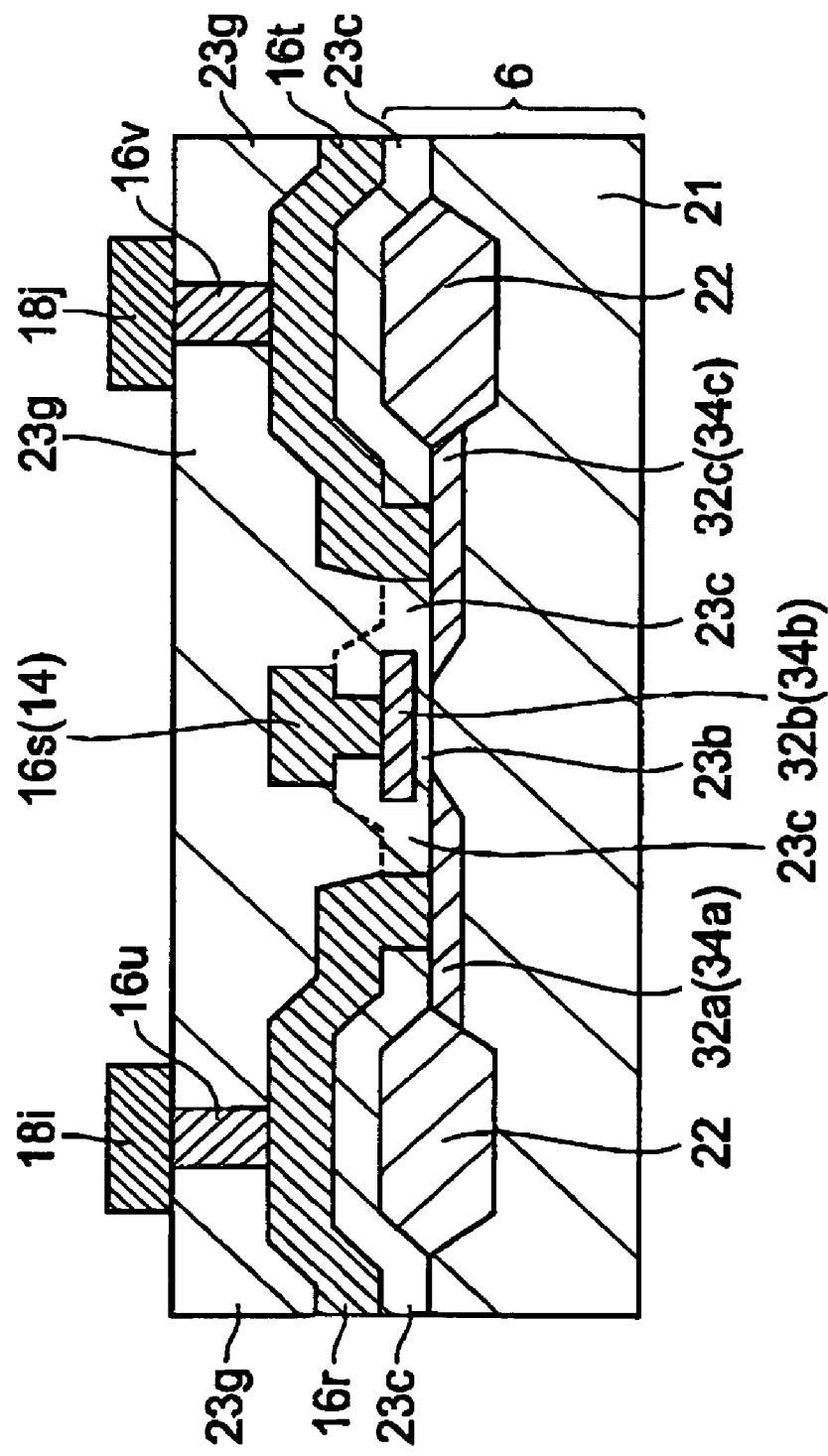
FIG. 24 is a diagram showing the mamufacturing process of the wiring layer.
Figure 25:
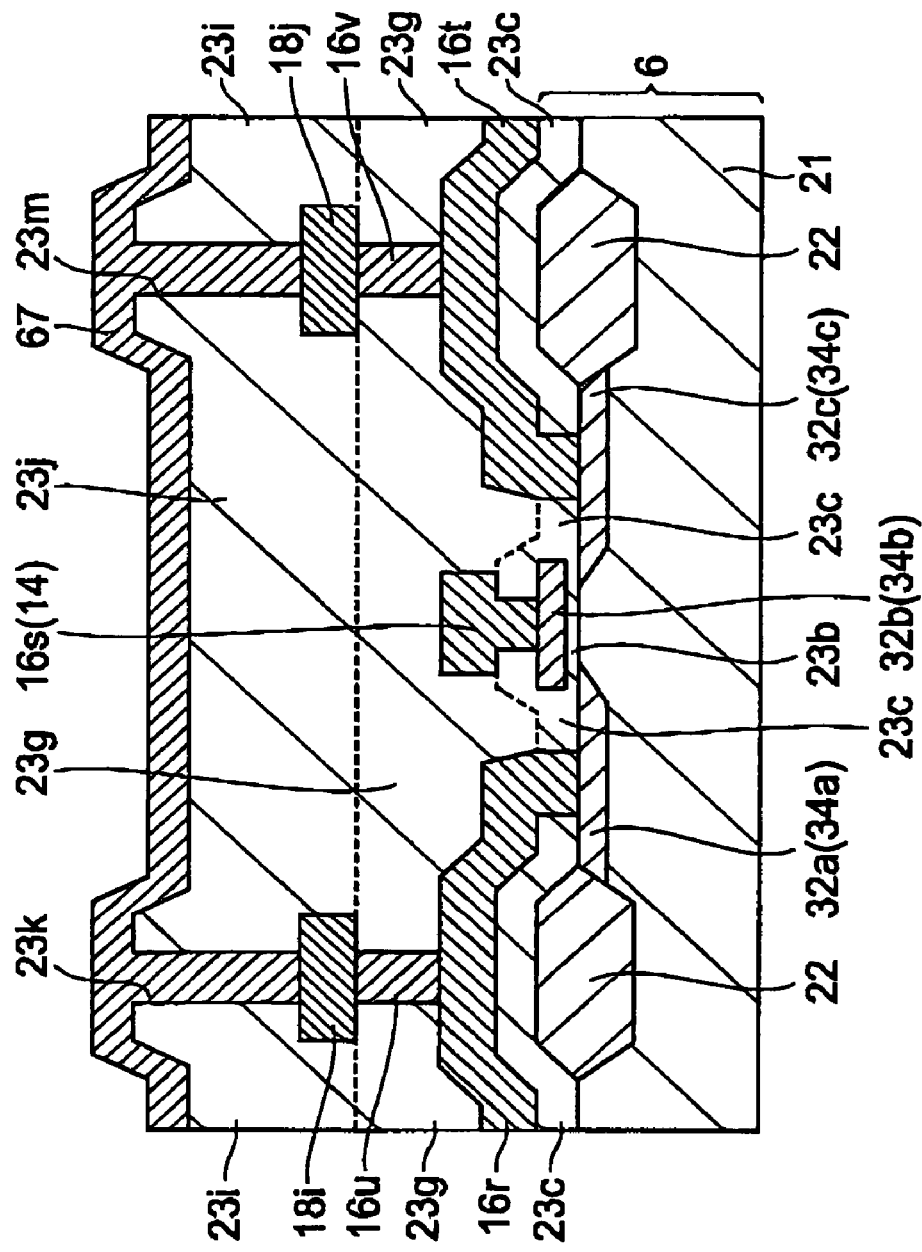
FIG. 25 is a diagram showing the mamufacturing process of the wiring layer.
Figure 26:
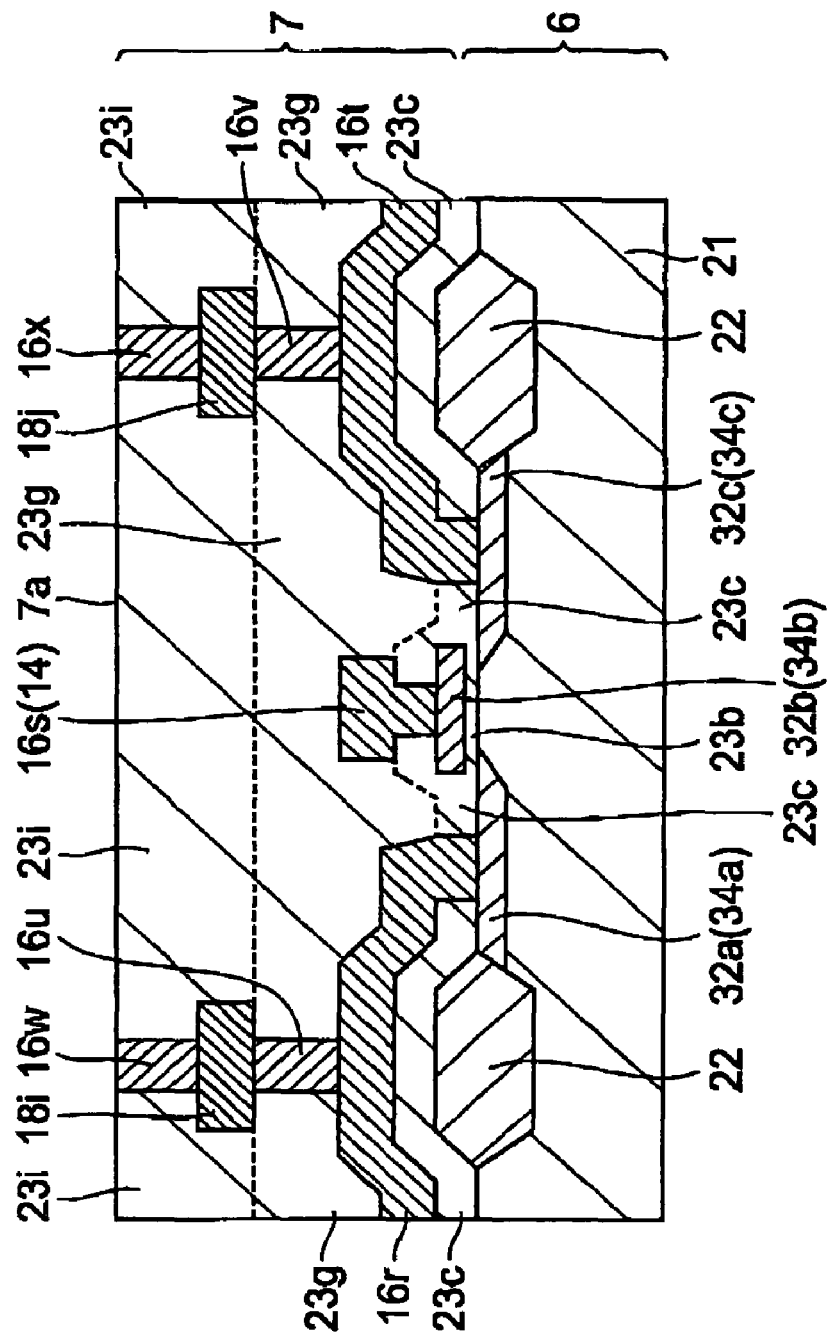
FIG. 26 is a diagram showing the mamufacturing process of the wiring layer.

Then, as shown in FIG. 23, on the flattened interlayer insulation film 23g and the vertical wirings 16u and 16v, an Al film 66 is formed in a manner of sputtering. After forming a resist mask of a predetermined pattern on the Al film 66, the Al film 66 is subjected to an etching (RIE) to form horizontal wirings 18i and 18j as shown in FIG. 24. These horizontal wirings 18i and 18j are an example of the horizontal wirings shown in FIG. 2 to FIG. 4. The horizontal wiring can be formed at a predetermined point using the above manufacturing method. Here, the bit wirings 13a and 13b disposed through the plurality of memory areas 3 are also formed using the same manufacturing process as that of the horizontal wiring 18i and 18j. After that, the vertical wirings and the horizontal wirings are repeatedly formed using the same manner as that in the above-described processes (refer to FIG. 19 to FIG. 24); thus, the every wiring within the wiring layer 7 is formed. After forming the vertical wirings, the interlayer insulation film is flattened; thus the forming processes of the wiring layer 7 are completed. That is, as show in FIG. 25, the uppermost interlayer insulation film 23i (which becomes a part of the insulating area 23) is formed; the holes 23k and 23m are formed in the interlayer insulation film 23i; and the W film 67 is formed on the interlayer insulation film 23i and inside the holes 23k and 23m. Then as shown in FIG. 26, the W film 67 formed in an area other than the holes 23k and 23m is removed in a manner of CMP, and the surface of the interlayer insulation film 23i is flattened, and vertical wirings 16w and 16x are formed. Using the same processes as those in the forming processes of the vertical wirings 16w and 16x, the vertical wirings 16b, 16c, 16g, and 16i shown in FIG. 2 to FIG. 4 are formed. Thus, the wiring layer 7 is completed. The flattened surface of the interlayer insulation film 23i becomes interface plane 7a between the forming process of the wiring layer 7 and the forming process of the magnetic material layer 8. The electrical connection between the wiring layer 7 and the magnetic material layer 8 in the interface plane 7a can be made using a vertical wiring formed of W.

When the anti-diffusion layer 36 is formed in the magnetic memory 1, after flattening the surface of the interlayer insulation film 23i, on the interlayer insulation film 23i, a film of Ti or Ru is formed in a manner of, for example, sputtering or the lie; thereby the anti-diffusion layer 36 can be preferably formed.

Figure 27:
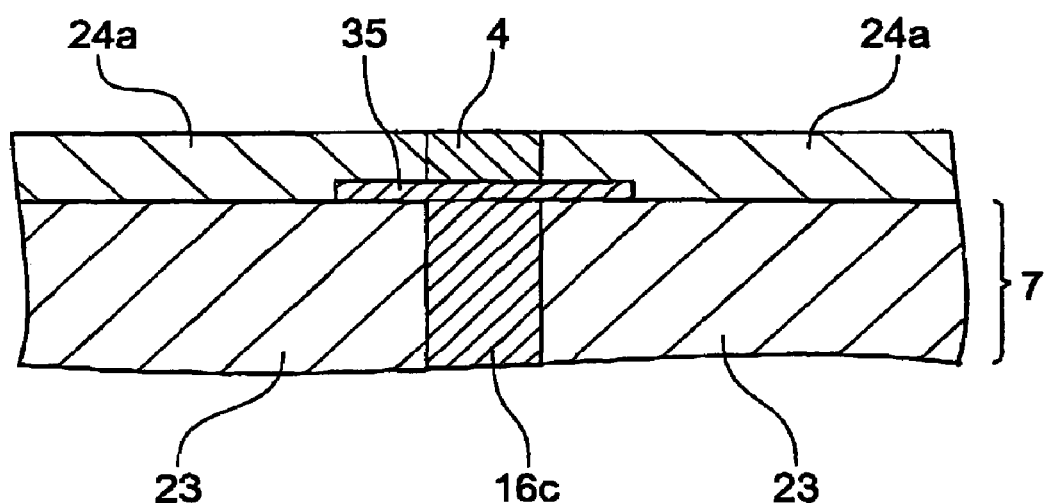
FIG. 27 is a diagram showing the mamufacturing process of a magnetic material layer.

Next, the magnetic material layer forming process will be described. As shown in FIG. 27, on the vertical wiring 16c of the wiring layer 7, the electrode 35 is formed. After that, to form the element 4, using a high vacuum (UHV) DC sputtering apparatus, for example, a base layer of Ta, an IrMn layer, a CoFe layer and an Al layer are formed in this order. After that, the Al layer is oxidized in a manner of oxygen plasma to form a tunnel insulation layer (i.e., a layer to be the nonmagnetic insulating layer 42 shown in FIG. 5 and FIG. 6), and then a CoFe layer and a Ta protection layer are formed.

Figure 28:
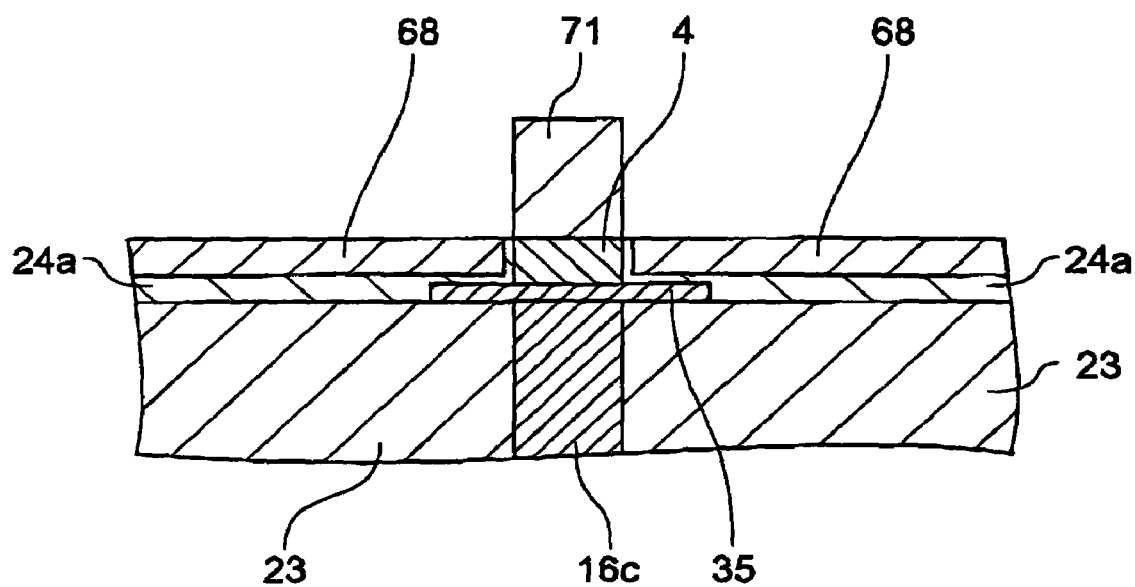
FIG. 28 is a diagram showing the mamufacturing process of the magnetic material layer.
Figure 29:
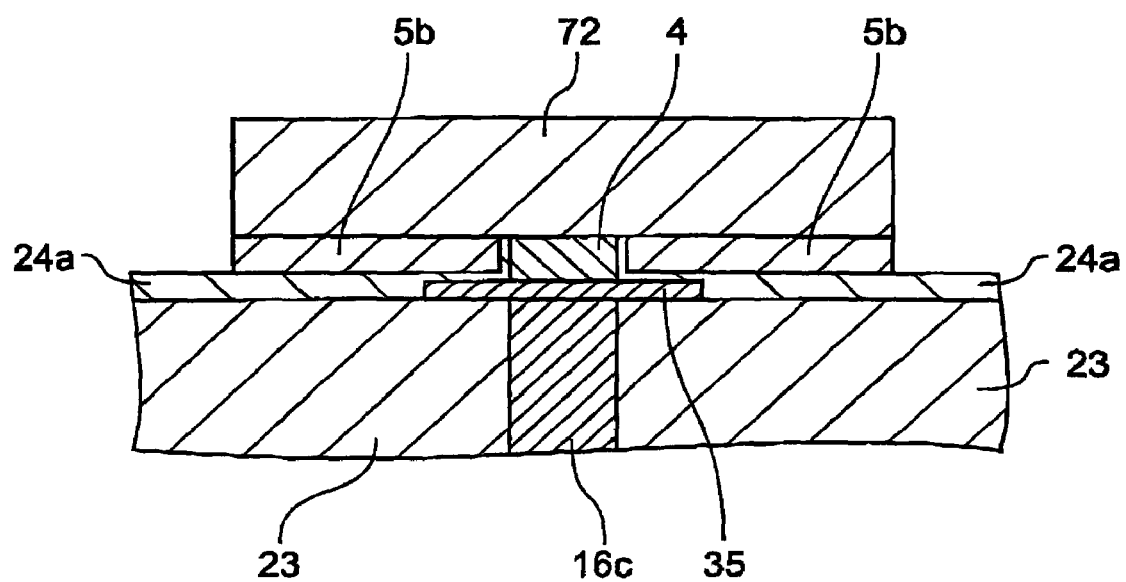
FIG. 29 is a diagram showing the mamufacturing process of the magnetic material layer.

Then, as shown in FIG. 28, after forming a resist mask 71 using a lithography apparatus, the TMR element 4 is formed in a manner of ion milling. After that, using a CVD apparatus, for example, side face of the TV element 4 is formed from Si $(OC_2H_5)_4$, and a $SiO_2$ insulating layer 24a is formed on the electrode 35. Further, to form a pair of opposed yokes 5b, using a spatter apparatus, for example, after forming a NiFe film 68, the resist mask 71 is removed. Then, as shown in FIG. 29, a resist mask 72 corresponding to the configuration of the opposed yokes 5b is formed on the NiFe film 68 and the TMR element 4, and then the NiFe film 68 is formed in a manner of ion milling to form a pair of opposed yokes 5b. After that the resist mask 72 is removed.

Figure 30:
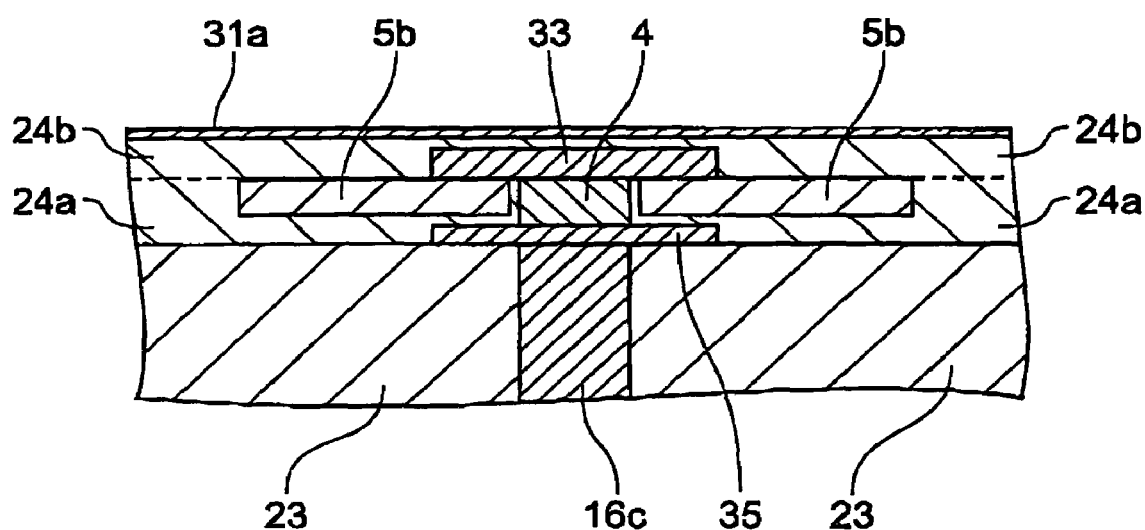
FIG. 30 is a diagram showing the mamufacturing process of the magnetic material layer.

Then, as shown in FIG. 30, the read wiring 33 is formed being in contact with the upper surface of the TMR element 4. Then, on the read wiring 33, the insulating layer 24a, and the opposed yokes 5b, an insulating layer 24b of the same material as that of the insulating layer 24a is formed in a manner of CVD. Then, a plating foundation film 31a of a material, which has a well conductivity, for example, Cu or the like, is formed on the insulating layer 24b in a manner of sputtering.

Figure 31:
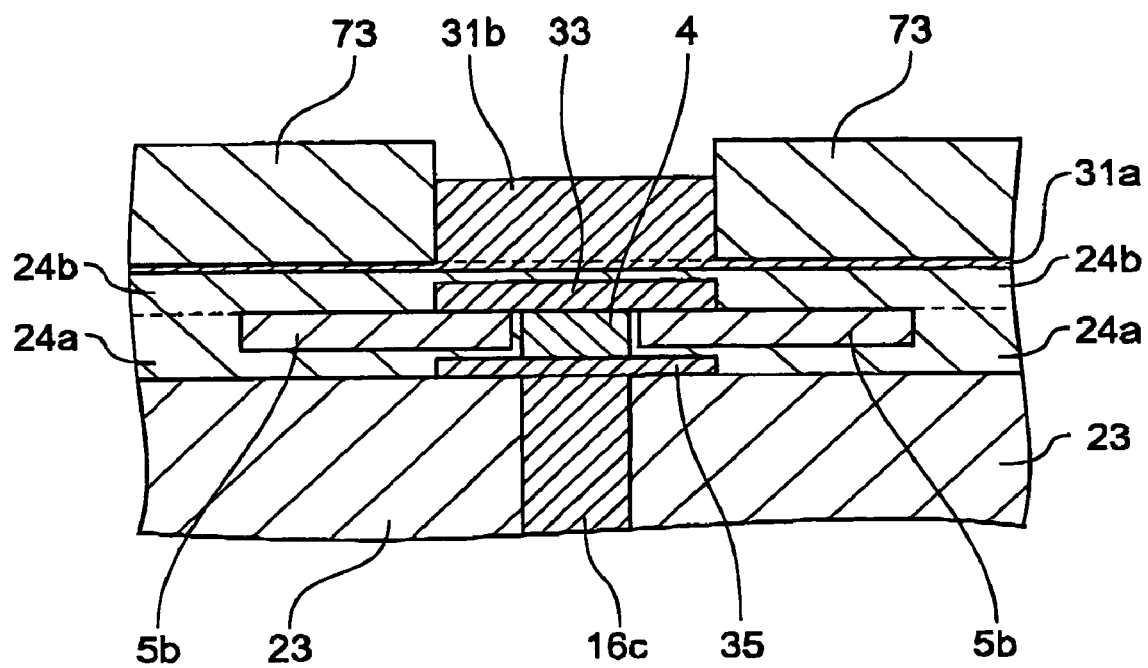
FIG. 31 is a diagram showing the mamufacturing process of the magnetic material layer.
Figure 32:
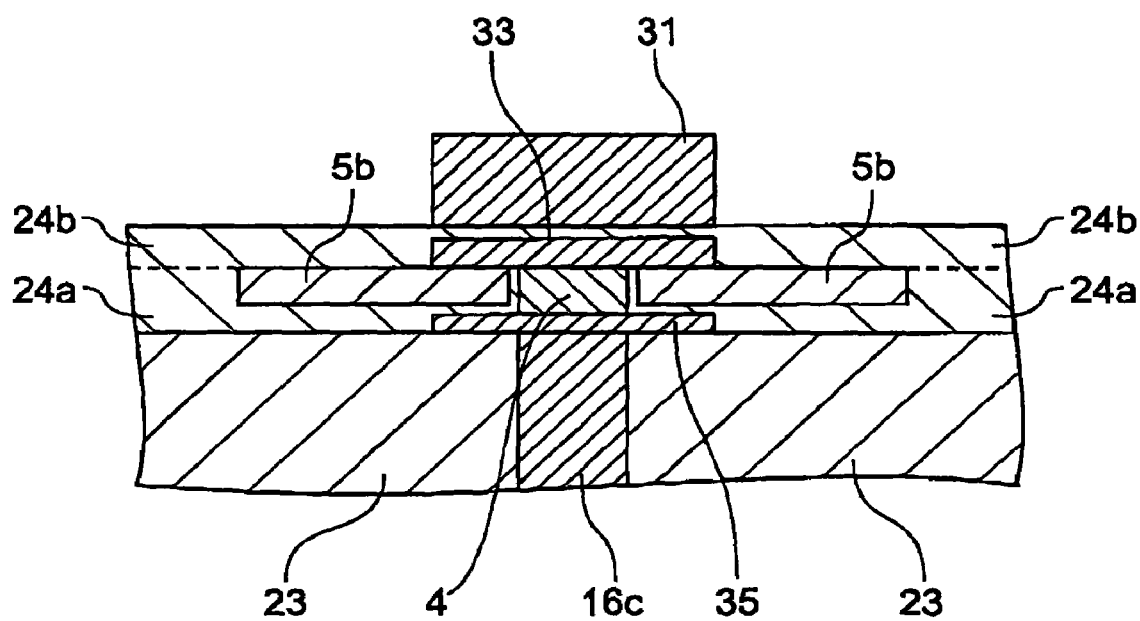
FIG. 32 is a diagram showing the mamufacturing process of the magnetic material layer.

Then, as shown in FIG. 31, on the plating foundation film 31a, a resist mask 73 is selectively formed. Here, the resist mask 73 having an opening, which is in an area above the TMR element 4 and is wider than the upper surface of the TMR element 4, is formed. Then, the entire of the magnetic memory 1 is immersed in a plating bath and carry out a plating treatment using the plating foundation film 31a as the electrode to form the write wiring 31b. After the plating treatment, as shown in FIG. 32, the resist mask 73 is removed. And further, in the plating foundation film 31a, the exposed portion is removed in a manner of milling. Thus, the write wiring 31 is formed.

Figure 33:
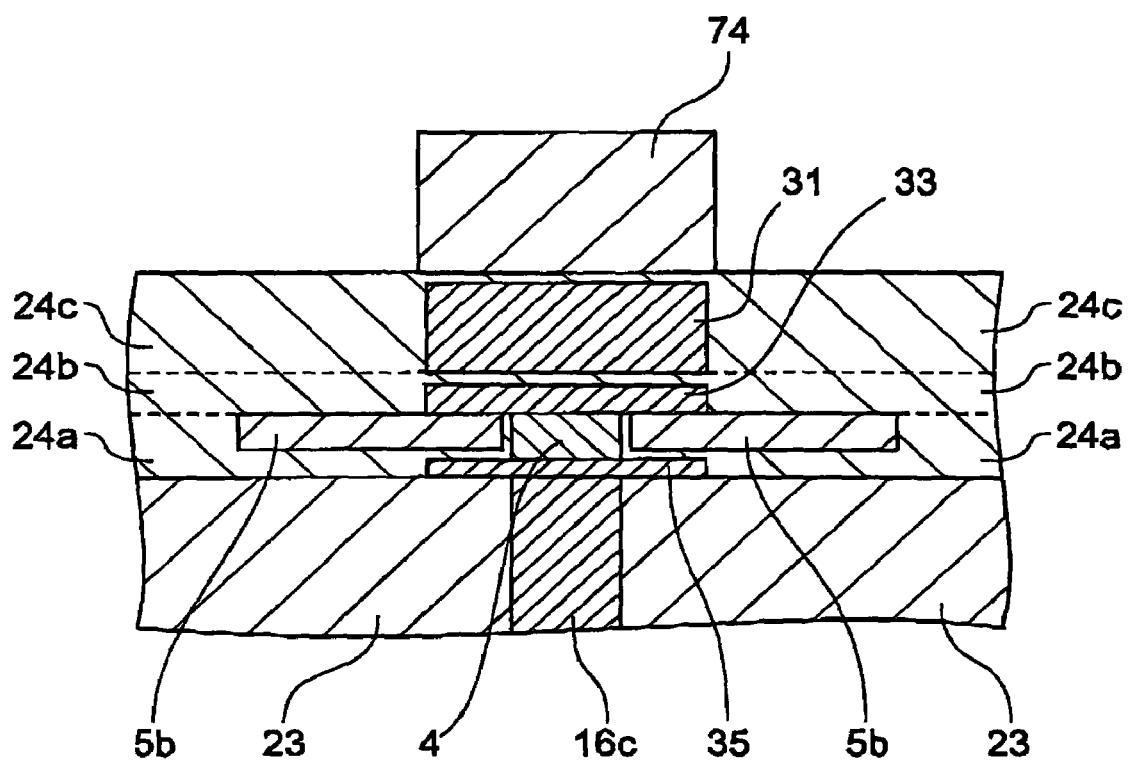
FIG. 33 is a diagram showing the mamufacturing process of the magnetic material layer.
Figure 34:
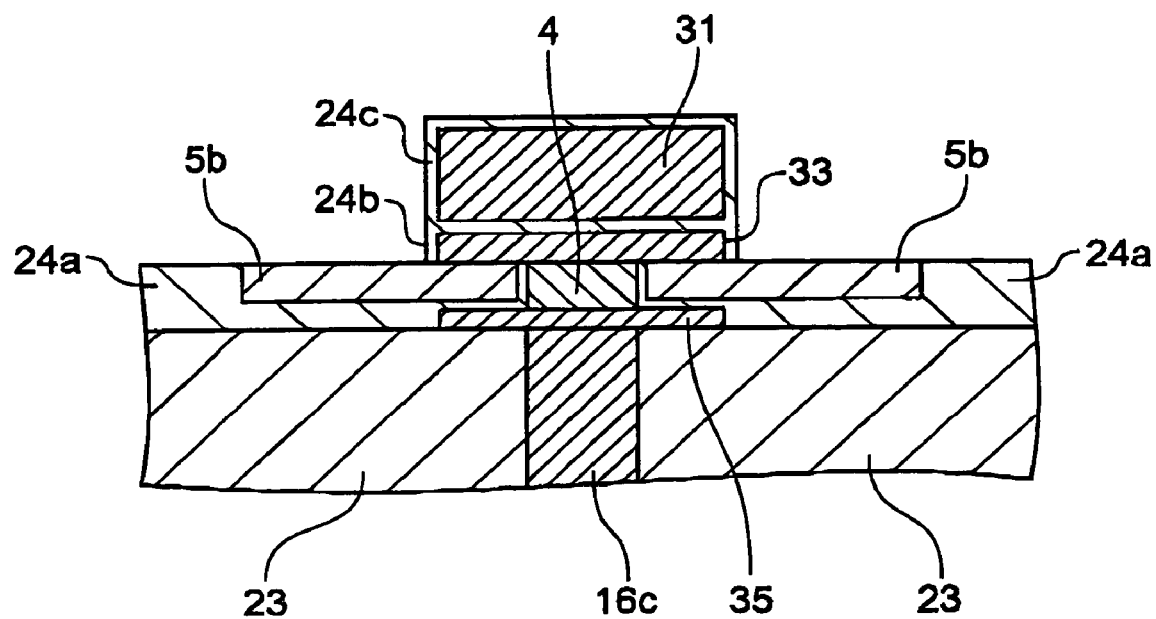
FIG. 34 is a diagram showing the mamufacturing process of the magnetic material layer.

Then, as shown in FIG. 33, an insulating layer 24c of the same material as that of the insulating layers 24a and 24b is formed on the write wiring 31 and the insulating layer 24b in a manner of CVD. And, on the insulating layer 24c, the resist mask 74 is formed selectively. Here, the resist mask 74 is formed in an area, which is above the write wiring 31 and slightly wider than the upper surface of the write wiring 31. In the insulating layers 24b and 24e, the portion uncovered by the resist mask 74 is removed in a manner of RIE or the like to expose the opposed yokes 5b. Then, the resist mask 74 is removed (refer to FIG. 34).

Figure 35:
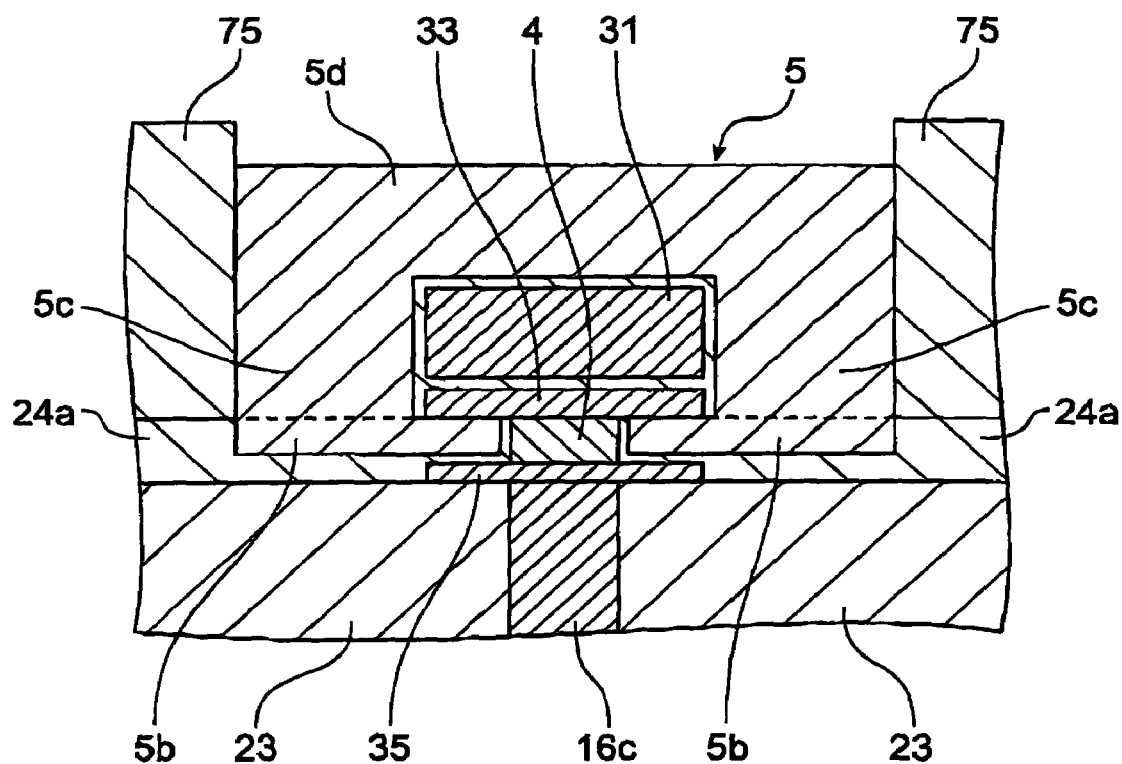
FIG. 35 is a diagram showing the mamufacturing process of the magnetic material layer.
Figure 36:
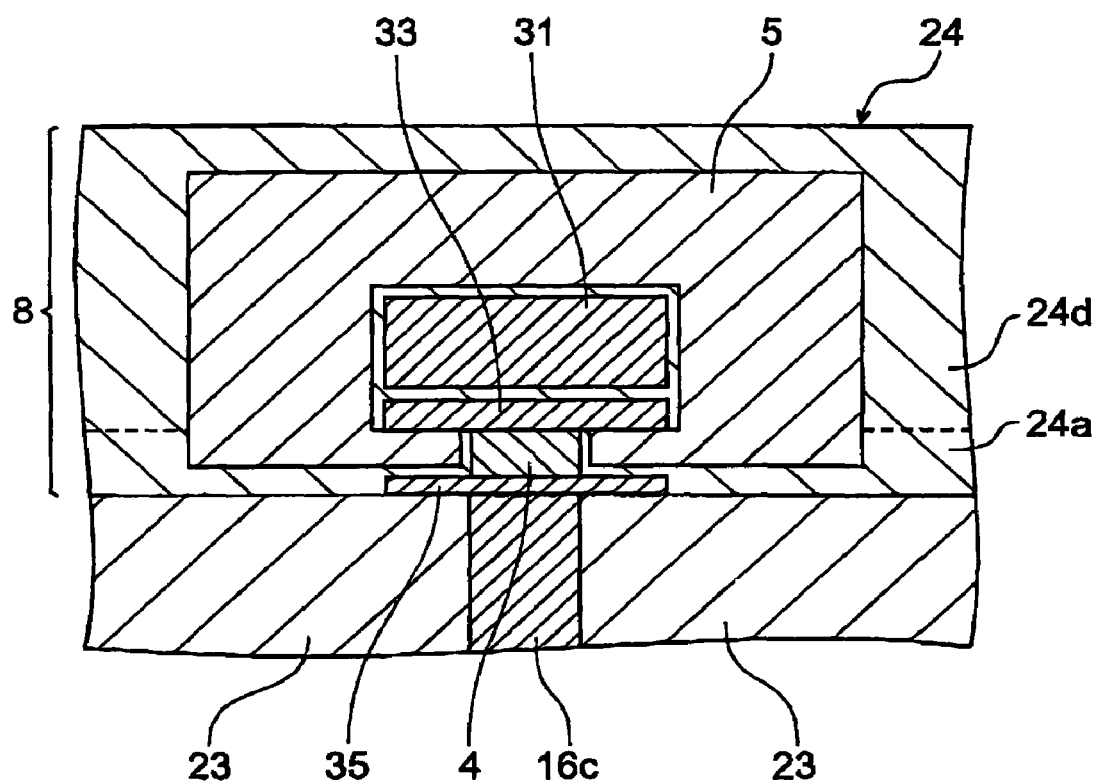
FIG. 36 is a diagram showing the mamufacturing process of the magnetic material layer.

Then, as shown in FIG. 35, on the insulating layer 24a, the resist mask 75 is formed selectively. Here, the resist mask 75 is formed so as not to cover the opposed yokes 5b and the write wiring 31. In the area where the resist mask 75 is not formed, for example, the pair of pillar yokes 5c and the beam yoke 5d are formed in a manner of sputtering. Thus, the magnetic yoke 5 including the pair of opposed yokes 5b, the pair of pillar yokes 5e, and the beam yoke 5d is formed. Last of all, as shown in FIG. 36, the resist mask 75 is removed, and an insulating layer 24d of the same material as that of the insulating layer 24a is formed on the insulating layer 24a and the magnetic yoke 5 in a manner of CVD. Thus, the insulating area 24 is formed and the magnetic material layer 8 is completed.

In the manufacturing method of the magnetic memory 1 as described above, the process in which the drain area 32a and the source area 32b of the write transistor 32 are formed in the semiconductor layer 6, the process in which the bit wirings 13a and 13b and the word wiring 14 are formed on the wiring layer 7 on the semiconductor layer 6 and the process in which the TMR element 4 and the magnetic yoke 5 are formed on the magnetic material layer 8 are perfectly separated from each other. Owing to this, when the TMR element 4 and the magnetic yoke 5 are formed in the magnetic material layer 8, the wiring layer 7 shuts off the ferromagnetic material; thus, the ferromagnetic material is effectively prevented from mixing into the drain area 32a and the source area 32b of the write transistor 32.

Further, in the above-described manufacturing method of the magnetic memory 1, since the semiconductor layer forming process, the wiring layer forming process and the magnetic material layer forming process are separated from each other, the semiconductor layer 6, the wiring layer 7 and the magnetic material layer 8 can be designed as a module, respectively. Accordingly, the manufacturing process can be more simplified.

Modification

Figure 37:
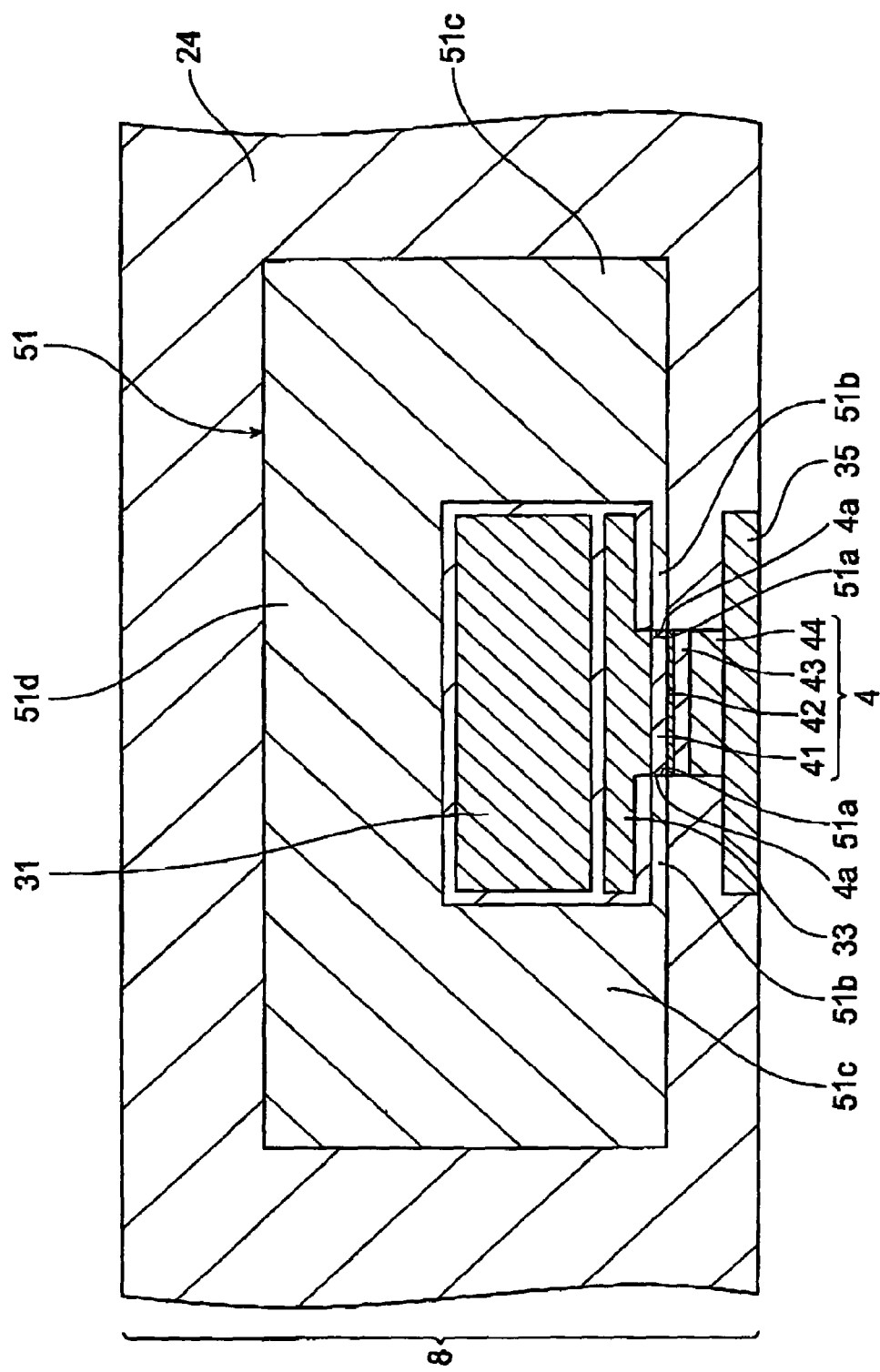
FIG. 37 is a diagram showing a configuration of a magnetic yoke in accordance with a modification.
Figure 38:
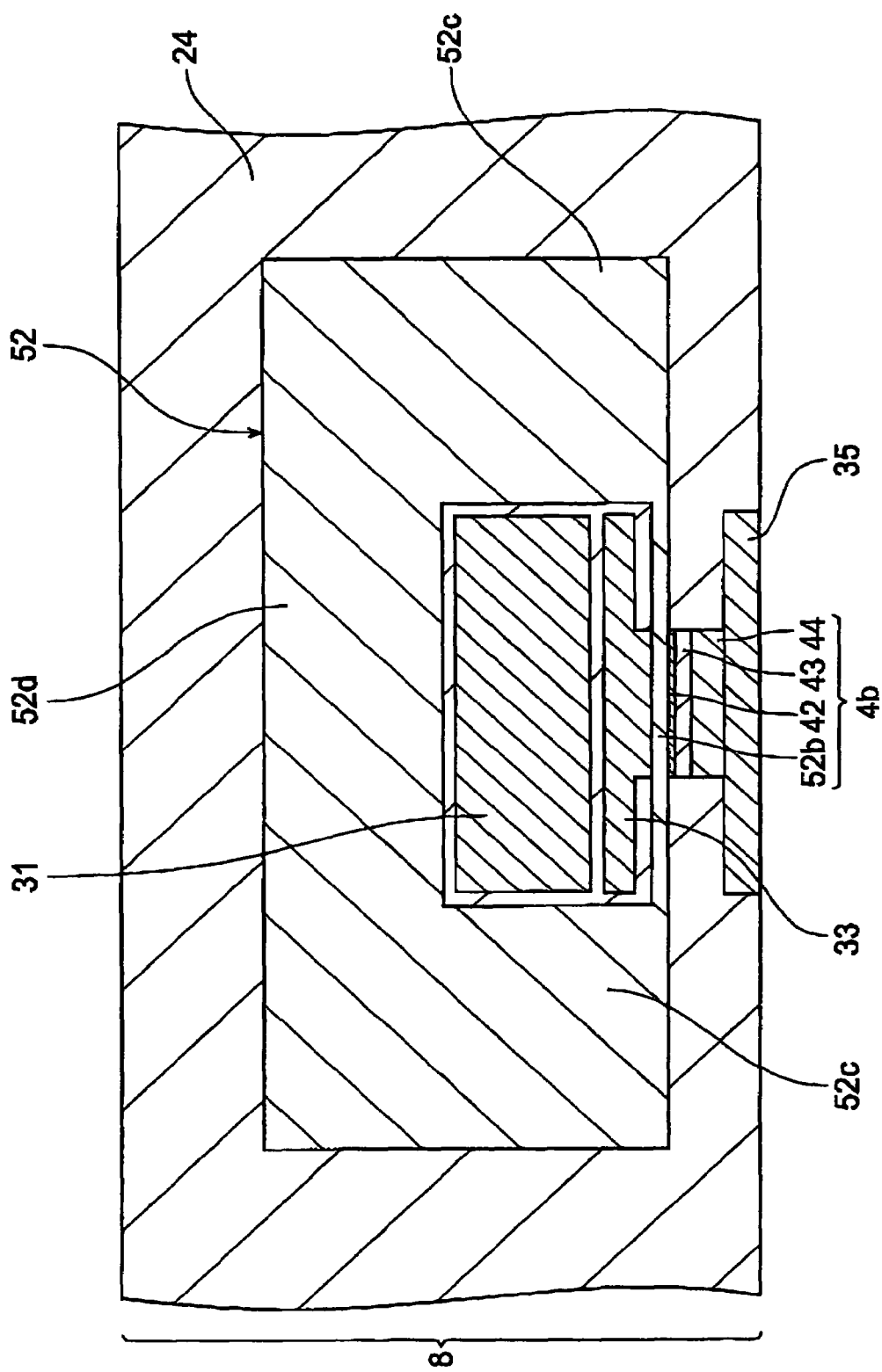
FIG. 38 is a diagram showing a configuration of a magnetic yoke in accordance with a modification.

Now, a modification of the magnetic memory 1 in accordance with the embodiment will be described FIG. 37 and FIG. 38 show a sectional view respectively illustrating the configuration of magnetic yokes 51 and 52 in accordance with the modification. Referring to FIG. 37, the magnetic yoke 51 is configured including a pair of opposed yokes 51b, a pair of pillar yokes 51c, and a beam yoke 51d. In the magnetic yoke 51, the constitution and configuration of the pair of pillar yokes 51c and the beam yoke 51d are the same as the constitution and configuration of the above-described pair of pillar yokes 5c and the beam yoke 5d of the magnetic yoke 5 (refer to FIG. 6). In the pair of opposed yokes 51b, in the side faces 4a of the TMR element 4, the end face 51a thereof is in contact with the side faces of the first magnetic layer 41. The magnetic yoke 51 may have such a configuration as described above; thereby, the magnetic field generated inside the magnetic yoke 51 by a write current can be provided to the first magnetic layer 41 more efficiently.

Further, referring to FIG. 38, a magnetic yoke 52 is configured including a first beam yoke 52b, a pair of pillar yokes 52c and a second beam yoke 51d. In the magnetic yoke 52, the first beam yoke 52b is disposed between the read wiring 33 and the nonmagnetic insulating layer 42 so as to serve commonly as the first magnetic layer of the TMR element 4b. One end of the first beam yoke 52b is continued to one of a pair of pillar yokes 52c, the other end of the first beam yoke 52b is continued to the another one of the pair of the pillar yokes 52c. The beam yoke 52d is formed along the surface at the side opposite to the TMR element 4 in the write wiring 31. The pair of pillar yokes 52c are formed along the side faces of the write wiring 31 to connect the both ends of the first beam yoke 52b and the both ends of the second beam yoke 52d. Owing to the above configuration, the first beam yoke 52b, the pair of pillar yoke 52c and the second beam yoke 52d completely enclose the outer periphery of the write wiring 31 at a portion of the write wiring 31 in the extending direction thereof (a portion on the TMR element 4). Accordingly, the magnetic field generated inside the magnetic yoke 52 by the write current can be provided more efficiently to the first magnetic layer (i.e., to the first beam yoke 52b).

The magnetic memory in accordance with the present invention is not limited to the above-described embodiment, but various modifications thereof are possible. For example, in the above embodiment, as the magnetoresistive effect element, the TMR element is used. However, a GMR element utilizing giant magnetoresistive (GMR) effect may be employed. The GMR effect means a phenomenon such that, when the angle formed by the two magnetizing directions of the ferromagnetic layers sandwiching a nonmagnetic layer changes, the resistant value of the ferromagnetic layers in the direction perpendicular to the build-up direction thereof changes. That is, in the GMR element, when the two magnetizing directions of the ferromagnetic layers are parallel to each other, the resistant value of the ferromagnetic layers becomes the minimum; and when the two magnetizing directions of the ferromagnetic layers are anti-parallel to each other, the resistant value of the ferromagnetic layers becomes the maximum. As for the TMR element and GMR element, a pseud-spin-valve type, in which write/read is carried out using the difference in coercive force between two ferromagnetic layers, and a spin-valve type, in which the magnetizing direction of one ferromagnetic layer is fixed by the exchange coupling with the antiferromagnetic layer are available. In the GMR element, the data read is carried out by detecting the change of the resistant value in the ferromagnetic layer in the direction perpendicular to the build-up direction. On the other hand, in the GMR element, the data write is carried out by inverting the magnetizing direction of one ferromagnetic layer using the magnetic field generated using a write current.

In the above embodiment, the magnetic yoke is formed integrally from one end face to the other end face in the peripheral direction of the write wiring. As for the configuration of the magnetic yoke, in addition to the above, for example, such a configuration that one or more gaps are included in the peripheral direction and the magnetic yoke is divided into a plurality of parts may be employed. Further, in the above embodiment, as the semiconductor write switching device and the semiconductor read switching device, transistors are provided. As for the switching devices, various semiconductor devices, which have a function to turn ON/OFF the current upon the necessity, may be employed.

What is claimed is:

1. A magnetic memory having a plurality of memory areas disposed in two-dimensional configuration of m rows and n columns, wherein m is an integer of 2 or more and n is an integer of 2 or more, each of said memory areas comprising:
   a magnetic material layer having:
   a magnetoresistive effect element including a magneto-sensitive layer of which magnetizing direction changes depending on an external magnetic field,
   a write wiring that provides an external magnetic field to the magneto-sensitive layer through a write current, and
   a read wiring electrically connected to said magnetoresistive effect element, that flows a read current to the magnetoresistive effect element;
   a semiconductor layer having:
   a first semiconductor area constituting a semiconductor write switching device that controls a conduction of the write current in said write wiring, and
   a second semiconductor area constituting a semiconductor read switching device that controls the conduction of the read current in the read wiring, and
   a wiring layer arranged between said magnetic material layer and said semiconductor layer, said wiring layer including:

a first wiring electrically connected to said write wiring, and a second wiring electrically connected to a control terminal of said semiconductor write switching device, wherein said second wiring is also connected to a control terminal of said semiconductor read switching device.

2. The magnetic memory according to claim 1, further comprising an anti-diffusion layer formed between said magnetic material layer and said semiconductor layer, that prevents an element included in the magnetoresistive effect element from diffusing into the semiconductor layer.

3. The magnetic memory according to claim 2,
wherein said anti-diffusion layer includes at least one element selected from a group consisting of Ti and Ru.

4. A manufacturing method of a magnetic memory having a plurality of memory areas disposed in two-dimensional configuration of m rows and n columns, wherein m is an integer of 2 or more and n is an integer of 2 or more, said method comprising the steps of:

forming a semiconductor layer;

forming a wiring layer on the semiconductor layer; and forming a magnetic material layer on the wiring layer, wherein the forming of the semiconductor layer includes forming a first semiconductor area constituting a semiconductor write switching device in each of the memory areas in the semiconductor layer, and a second semiconductor area constituting a semiconductor read switching device in each of the memory areas in the semiconductor layer, the forming of the wiring layer includes forming a first wiring corresponding to each column of the memory areas and a second wiring, which is provided corresponding to each row of the memory areas and electrically connected to a control terminal of the semiconductor write switching device included in each of the memory areas in the corresponding row in the wiring layer, wherein said second wiring is also connected to a control terminal of said semiconductor read switching device, and the forming of the magnetic material layer includes forming a magneto-resistive effect element including a magneto-sensitive layer, which is provided to each of the memory areas and the magnetizing direction thereof changes depending on the external magnetic field, and a write wiring formed in each of the memory areas and electrically connected to the first wiring for providing the external magnetic field through write current to the magneto-sensitive layer.

* * * * *